United States Patent
Kim et al.

(10) Patent No.: US 11,114,467 B2
(45) Date of Patent: Sep. 7, 2021

(54) DISPLAY DEVICE

(71) Applicant: LG Display Co., Ltd., Seoul (KR)

(72) Inventors: YoungMi Kim, Paju-si (KR); Yeonsuk Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 44 days.

(21) Appl. No.: 16/545,581

(22) Filed: Aug. 20, 2019

(65) Prior Publication Data

US 2020/0168637 A1  May 28, 2020

(30) Foreign Application Priority Data

Nov. 28, 2018  (KR) .................. 10-2018-0149927

(51) Int. Cl.
*H01L 27/32* (2006.01)
*H01L 27/12* (2006.01)
*G02B 27/01* (2006.01)

(52) U.S. Cl.
CPC ........ *H01L 27/1214* (2013.01); *G02B 27/017* (2013.01); *H01L 27/3246* (2013.01); *H01L 27/3248* (2013.01); *H01L 27/3262* (2013.01)

(58) Field of Classification Search
CPC .................................................. H01L 27/3223
See application file for complete search history.

(56) References Cited

U.S. PATENT DOCUMENTS

2005/0156515 A1  7/2005  Fukase
2010/0238096 A1  9/2010  Jeon et al.
2017/0005144 A1  1/2017  Akagawa et al.
2017/0117338 A1  4/2017  Shirahata et al.
2017/0195658 A1  7/2017  Jung
2017/0236879 A1  8/2017  Kubota
2017/0352707 A1  12/2017  Kim et al.
2017/0352709 A1  12/2017  Hack et al.
2018/0019238 A1  1/2018  Kim et al.

(Continued)

FOREIGN PATENT DOCUMENTS

CN  106959511 A  7/2017
CN  107887411 A  4/2018

(Continued)

OTHER PUBLICATIONS

Office Action issued in corresponding JP Patent Application No. 2019-152483 dated Sep. 15, 2020.

*Primary Examiner* — Christopher A Johnson
(74) *Attorney, Agent, or Firm* — Morgan, Lewis & Bockius LLP

(57) ABSTRACT

The display device includes a substrate including first and second sub pixels, a first electrode patterned in each of the first and second sub pixels on the substrate, a first emission layer in each of the first and second sub pixels on the first electrode to emit first colored light, a second electrode in each of the first and second sub pixels on the first emission layer, a second emission layer on the second electrode to emit second colored light, and a third electrode on the second emission layer. The first electrode of the first sub pixel is relatively larger than the first electrode of the second sub pixel, the first electrode of the first sub pixel is electrically connected with the second electrode of the first sub pixel, and the first electrode of the second sub pixel is insulated from the second electrode of the second sub pixel.

17 Claims, 13 Drawing Sheets

(56) References Cited

U.S. PATENT DOCUMENTS

| | | |
|---|---|---|
| 2018/0095195 A1 | 4/2018 | Kim et al. |
| 2018/0138441 A1 | 5/2018 | Choung et al. |
| 2018/0219050 A1 | 8/2018 | Ota et al. |

FOREIGN PATENT DOCUMENTS

| | | | |
|---|---|---|---|
| EP | 3240037 A1 | 11/2017 | |
| JP | 2005-222928 A | 8/2005 | |
| JP | 2010-3629 A | 1/2010 | |
| JP | 2010-10041 A | 1/2010 | |
| JP | 2010-33983 A | 2/2010 | |
| JP | 2010-225587 A | 10/2010 | |
| JP | 2017-79160 A | 4/2017 | |
| JP | 2018-10298 A | 1/2018 | |
| KR | 10-2017-0137577 A | 12/2017 | |
| TW | 201820609 A | 6/2018 | |
| TW | 201841361 A | 11/2018 | |
| WO | WO-2010013644 A1 * | 2/2010 | ............. H05B 33/26 |

\* cited by examiner

DISPLAY DEVICE

BACKGROUND

Technical Field

The present disclosure relates to a display device configured to display an image.

Description of the Related Art

With the advancement of an information-oriented society, requirements for a display device of displaying an image are increasing in various types. Recently, various display devices such as liquid crystal display (LCD), plasma display panel (PDP) and organic light emitting display (OLED) have been utilized.

Recently, a head mounted display (HMD) device comprising the above display device has been developed. The head mounted display (HMD) device, which is worn as part of glasses or helmet, is an eyeglass-type monitor device of virtual reality (VR) or augmented reality (AR) in which a focus is formed within a short distance in front of user's eyes.

In case of the head mounted display (HMD) device, it is difficult to precisely pattern a different-colored emission layer by each individual sub pixel due to a compact interval between each of the sub pixels so as to realize a high resolution. In order to overcome this problem, the head mounted display (HMD) device is provided with a white colored emission layer comprising a plurality of stacks configured to emit different colored light, wherein the white colored emission layer functions as a common layer, and is also provided with a color filter disposed by each individual sub pixel, to thereby realize different colored light. In this case, the head mounted display (HMD) device is advantageous in that it does not require a process of manufacturing a precise mask, and a mask alignment process. However, in case of the head mounted display (HMD) device, it has a problem related with an increased power consumption due to the plurality of stacks.

SUMMARY

Accordingly, embodiments of the present disclosure are directed to a display device that substantially obviates one or more of the problems due to limitations and disadvantages of the related art.

An aspect of the present disclosure is to provide a display device capable of reducing a power consumption.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises a substrate including a first sub pixel and a second sub pixel, a first electrode patterned in each of the first sub pixel and the second sub pixel on the substrate, a first emission layer provided in each of the first sub pixel and the second sub pixel on the first electrode, and configured to emit first colored light, a second electrode provided in each of the first sub pixel and the second sub pixel on the first emission layer, a second emission layer provided on the second electrode, and configured to emit second colored light, and a third electrode provided on the second emission layer, wherein the first electrode of the first sub pixel is relatively larger than the first electrode of the second sub pixel, and the first electrode of the first sub pixel is electrically connected with the second electrode of the first sub pixel, and the first electrode of the second sub pixel is insulated from the second electrode of the second sub pixel.

In another aspect, a display device comprises a substrate including a first sub pixel, a second sub pixel, and a third sub pixel, a first electrode patterned in each of the first sub pixel, the second sub pixel, and the third sub pixel on the substrate, a first emission layer provided on the first electrode and configured to emit first colored light, a second electrode provided on the first emission layer, a second emission layer provided on the second electrode and configured to emit second colored light, and a third electrode provided on the second emission layer, wherein the same voltage is applied to the first electrode and the second electrode in each of the first sub pixel and the third sub pixel, and the same voltage is applied to the second electrode and the third electrode in the second sub pixel.

According to the present disclosure, the first emission layer and the second emission layer are formed in the sub pixels without using a mask, whereby it is possible to prevent a problem caused when different emission layers are patterned by the individual sub pixels through the use of mask. That is, according to the present disclosure, it has no requirement for a process of manufacturing a precise mask, and a precise mask alignment process. Thus, the present disclosure may be applied even to a high-resolution display device with a compact pixel interval.

Also, according to the present disclosure, even though the first emission layer and the second emission layer are formed in all the sub pixels, it is possible to operate any one of the first and second emission layers in each sub pixel. Accordingly, the display device according to the present disclosure enables remarkably-reduced power consumption.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
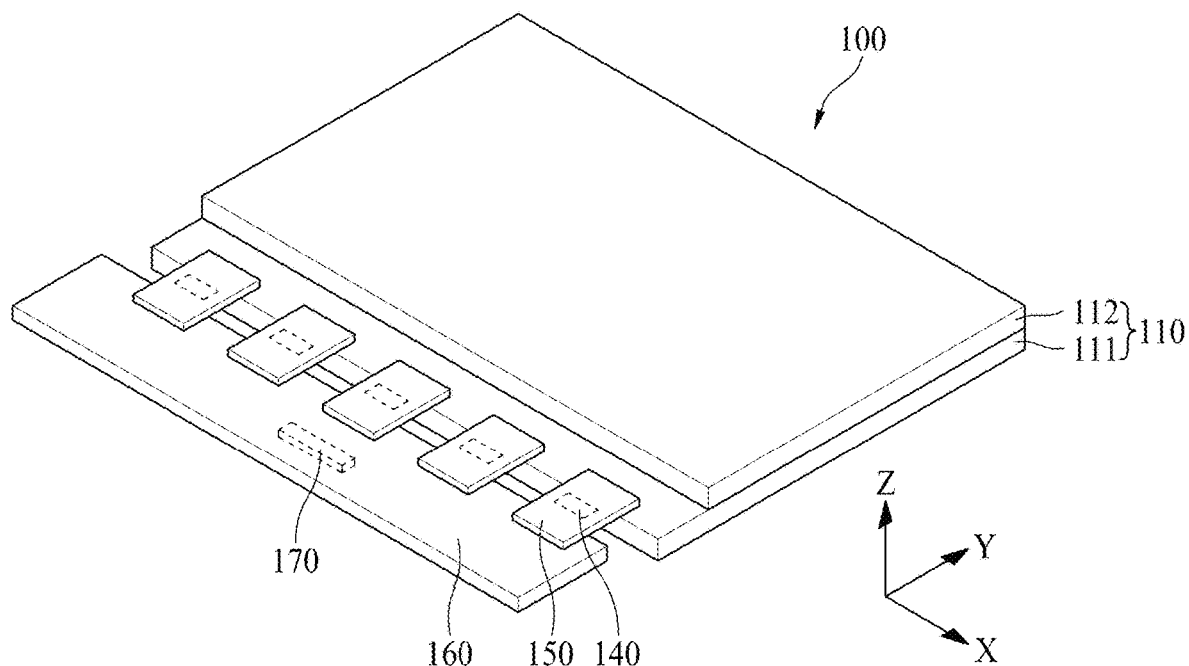
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~' and 'next to~', one or more portions may be arranged between two other portions unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "X-axis direction," "Y-axis direction," and "Z-axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings.

Figure 2:
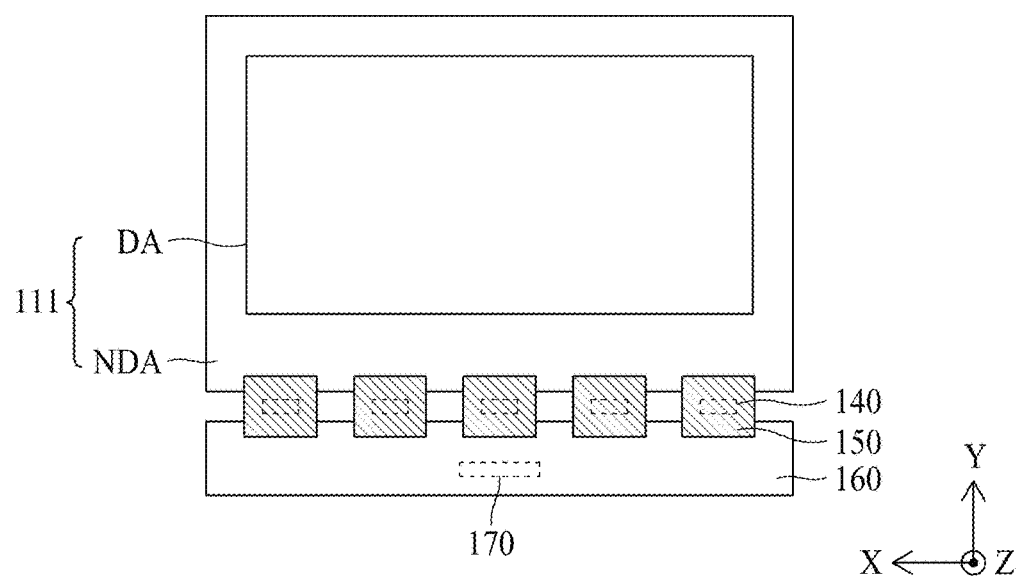
FIG. 2 is a plane view illustrating a first substrate, a source drive IC, a flexible film, a circuit board, and a timing controller of FIG. 1.

FIG. 1 is a perspective view illustrating a display device according to one embodiment of the present disclosure. FIG. 2 is a plane view illustrating a first substrate, a source drive IC, a flexible film, a circuit board, and a timing controller of FIG. 1.

Referring to FIGS. 1 and 2, the display device 100 according to one embodiment of the present disclosure includes a display panel 110, a source drive integrated circuit (hereinafter, referred to as a "source drive IC") 140, a flexible film 150, a circuit board 160, and a timing controller 170.

The display panel 110 includes a first substrate 111 and a second substrate 112. The second substrate 112 may be an encapsulation substrate. The first substrate 111 may be a plastic film, a glass substrate, or a silicon wafer substrate manufactured by a semiconductor process. The second substrate 112 may be a plastic film, a glass substrate, or an encapsulation film.

On one surface of the first substrate 111 confronting the second substrate 112, there are gate lines, data lines, and sub pixels. The sub pixels are prepared in respective areas defined by crossing the gate lines and the data lines.

Each of the sub pixels may include a thin film transistor, and a light emitting device including an anode electrode, an emission layer, and a cathode electrode. If a gate signal is supplied from the gate line to each sub pixel through the use of thin film transistor, a predetermined current is supplied to the light emitting device in accordance with a data voltage of the data line. Accordingly, when a high potential voltage is applied to the anode electrode, and a low potential voltage is applied to the cathode electrode, the light emitting device for each of the sub pixels may emit light with a predetermined brightness in accordance with the predetermined current.

The display panel 110 may include a display area (DA) provided with the sub pixels for displaying an image, and a non-display area (NDA) in which an image is not displayed. The gate lines, the data lines, and the sub pixels may be provided in the display area (DA), and a gate driver and pads may be provided in the non-display area (NDA).

The gate driver supplies gate signals to the gate lines in accordance with a gate control signal which is provided from the timing controller 170. The gate driver may be provided in one side of the display area (DA) of the display panel 110, or the non-display area (NDA) of both peripheral sides of the display panel 110 by a gate driver in panel (GIP) method. In another way, the gate driver may be manufactured in a driving chip, may be mounted on the flexible film, and may be attached to one side of the display area (DA) of the display panel 110, or the non-display area (NDA) of both peripheral sides of the display panel 110 by a tape automated bonding (TAB) method.

The source drive IC 140 receives digital video data and source control signals from the timing controller 170. The source drive IC 140 converts the digital video data into analog data voltages in accordance with the source control signal, and supplies the analog data voltages to the data lines. If the source drive IC 140 is manufactured in a driving chip, the source drive IC 140 may be mounted on the flexible film 150 by a chip on film (COF) method or a chip on plastic (COP) method.

The pads such as data pads may be provided in the non-display area (NDA) of the display panel 110. In the flexible film 150, there are lines for connecting the pads with the source drive IC 140, and lines for connecting the pads with the lines of the circuit board 160. The flexible film 150 is attached to the pads by the use of anisotropic conducting film, whereby the pads may be connected with the lines of the flexible film 150.

The circuit board 160 may be attached to the flexible film 150. A plurality of circuits, which are realized in a plurality of driving chips, may be mounted on the circuit board 160. For example, the timing controller 170 may be mounted on the circuit board 160. The circuit board 160 may be a printed circuit board or a flexible printed circuit board.

The timing controller 170 receives digital video data and a timing signal from an external system board via a cable of the circuit board 160. The timing controller 170 generates the gate control signal for controlling an operation timing of the gate driver and the source control signal for controlling the source drive IC 140 on the basis of the timing signal. The timing controller 170 supplies the gate control signal to the gate driver, and supplies the source control signal to the source drive IC 140.

Figure 3:
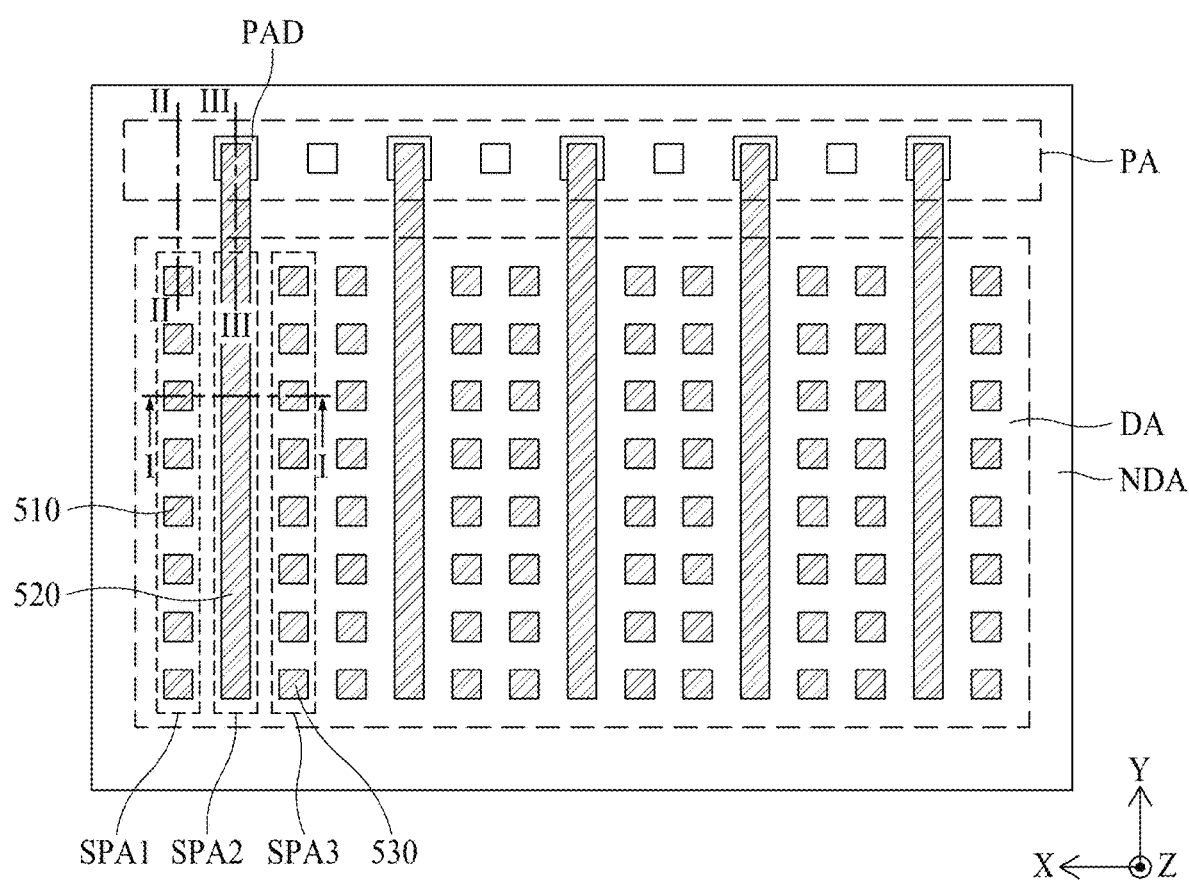
FIG. 3 is a schematic plane view illustrating the first substrate of a display panel according to one embodiment of the present disclosure.
Figure 4:
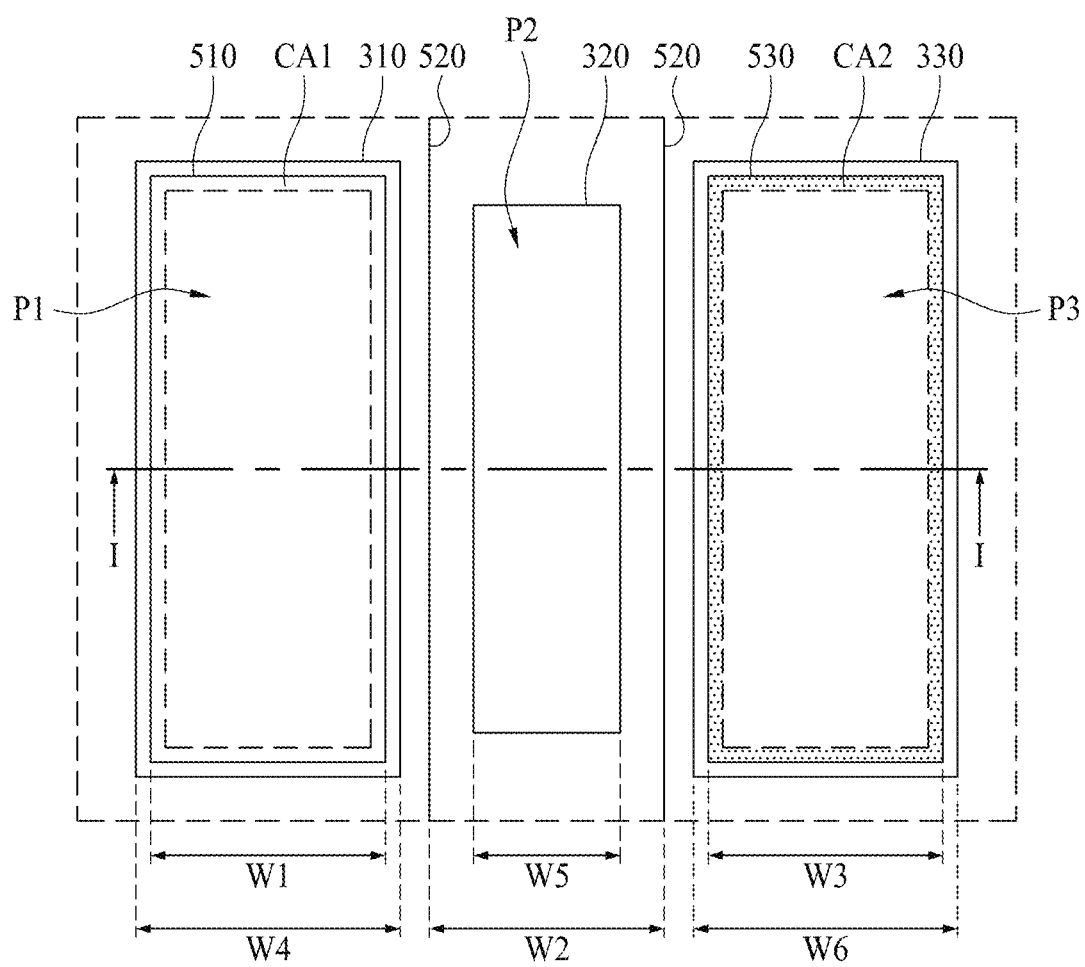
FIG. 4 is a schematic plane view illustrating one embodiment of first to third sub pixels.
Figure 5:
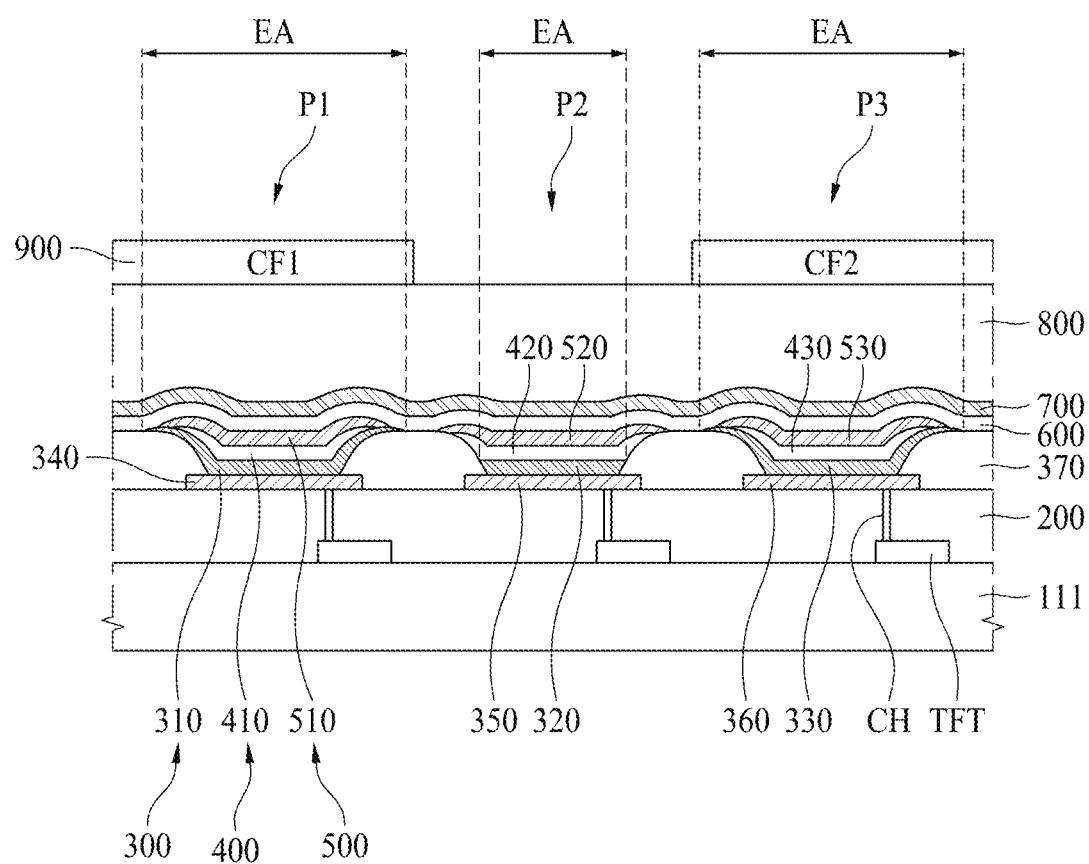
FIG. 5 is a cross sectional view along I-I of FIG. 3.
Figure 6:
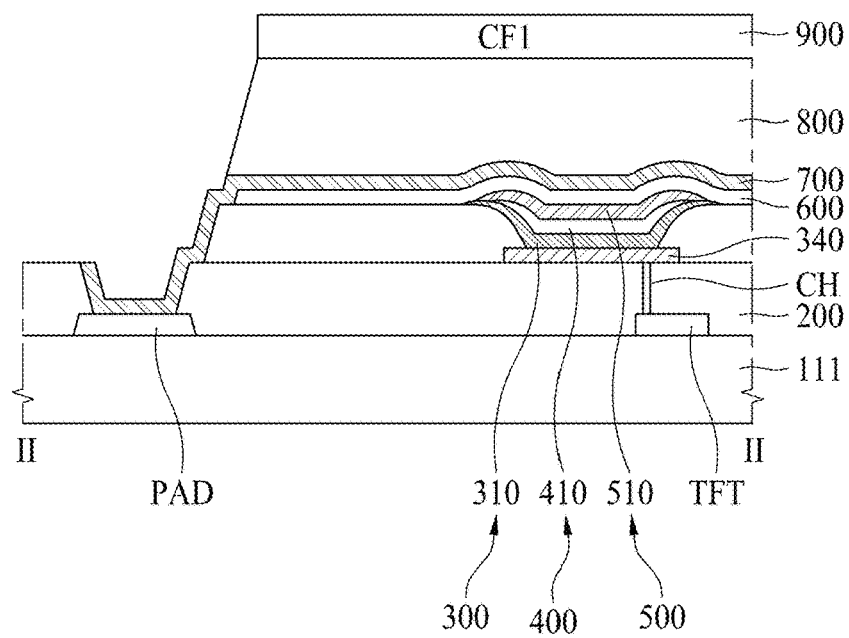
FIG. 6 is a cross sectional view along II-II of FIG. 3.
Figure 7:
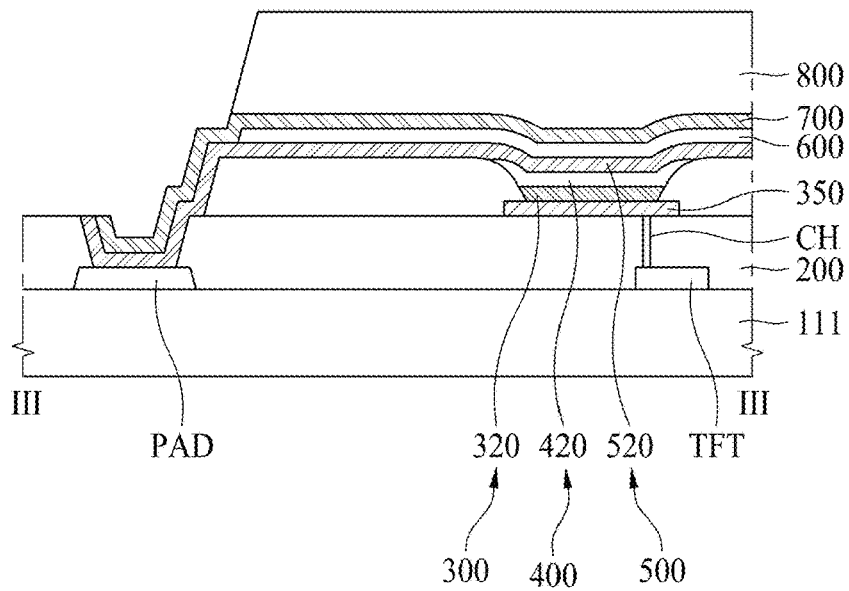
FIG. 7 is a cross sectional view along of FIG. 3.

FIG. 3 is a schematic plane view illustrating the first substrate of the display panel according to one embodiment of the present disclosure. FIG. 4 is a schematic plane view illustrating one embodiment of first to third sub pixels. FIG. 5 is a cross sectional view along I-I of FIG. 3. FIG. 6 is a cross sectional view along II-II of FIG. 3. FIG. 7 is a cross sectional view along III-III of FIG. 3.

Referring to FIGS. 3 to 7, on the first substrate 111 of the display panel 110 according to one embodiment of the present disclosure, there are a circuit device layer 200, a first electrode 300, a first emission layer 400, a second electrode 500, a second emission layer 600, a third electrode 700, and an encapsulation layer 800. According to one embodiment of the present disclosure, the display device 100 may further include at least one from an auxiliary electrode 340, 350 and 360 and a color filter 900 on the first substrate 111.

The first substrate 111 is divided into the display area (DA) and the non-display area (NDA). In the non-display area (NDA), there is a pad area (PA) provided with the pads (PAD). In the display area (DA) of the first substrate 111, there may be a first sub pixel (P1), a second sub pixel (P2), and a third sub pixel (P3). The first sub pixel (P1) is configured to emit red colored light, the second sub pixel (P2) is configured to emit blue colored light, and the third sub pixel (P3) is configured to emit green colored light, but not limited to this structure. A fourth sub pixel, which is configured to emit white (W) colored light, may be provided in the display area (DA) of the first substrate 111.

The first substrate 111 may be formed of a glass or plastic material, but not limited to these materials. For example, the first substrate 111 may be formed of a semiconductor material such as silicon wafer. The first substrate 111 may be formed of a transparent material or an opaque material.

The display device 100 according to one embodiment of the present disclosure may be formed in a top emission type where emitted light advances upwardly, but not limited to this type. If the display device 100 is formed in the top emission type where emitted light advances upwardly, the first substrate 111 may be formed of an opaque material as well as a transparent material. Meanwhile, the display device 100 according to one embodiment of the present disclosure is formed in a bottom emission type wherein emitted light advances downwardly, the first substrate 111 may be formed of a transparent material.

The circuit device layer 200 is provided on the first substrate 111.

In the circuit device layer 200, a circuit device comprising various signal lines, thin film transistors, and a capacitor is provided by each sub pixel (P1, P2, P3). The signal lines may include a gate line, a data line, a power line, and a reference line, and the thin film transistors may include a switching thin film transistor, a driving thin film transistor (TFT), and a sensing thin film transistor.

The switching thin film transistor is switched by a gate signal supplied to the gate line, and the switching thin film transistor supplies a data voltage, which is supplied from the data line, to the driving thin film transistor (TFT).

The driving thin film transistor (TFT) is switched by the data voltage supplied from the switching thin film transistor, and the driving thin film transistor (TFT) generates a data current from power source supplied from the power line, and supplies the data current to the first electrode 300.

The sensing thin film transistor senses a deviation of threshold voltage in the driving thin film transistor (TFT), which causes a deterioration of picture quality. The sensing thin film transistor supplies a current of the driving thin film transistor (TFT) to the reference line in response to a sensing control signal supplied from the gate line or an additional sensing line.

The capacitor maintains the data voltage supplied to the driving thin film transistor (TFT) for one frame period, and the capacitor is connected with each of gate and source terminals of the driving thin film transistor (TFT).

In the circuit device layer 200, there may be an insulating film (not shown) provided between the thin film transistor and the first electrode 300. In more detail, the circuit device layer 200 may include at least one of a protection film (not shown) for protecting the thin film transistor, and a planarization film (not shown) for planarizing a step difference caused by the thin film transistor.

Also, a contact hole (CH) which penetrates through the protection film and the planarization film may be provided in the circuit device layer 200 by each sub pixel (P1, P2, P3). Through the contact hole (CH), a source terminal or drain terminal of the driving thin film transistor (TFT) may be exposed.

The first electrode 300 is patterned by each sub pixel (P1, P2, P3) on the circuit device layer 200. One of the first electrode 310 is patterned in the first sub pixel (P1), another first electrode 320 is patterned in the second sub pixel (P2), and another first electrode 330 is patterned in the third sub pixel (P3).

The first electrode 310, 320 and 330 is connected with the driving thin film transistor (TFT) provided in the circuit device layer 200. In detail, the auxiliary electrode 340, 350 and 360 may be patterned by each sub pixel (P1, P2, P3), as shown in FIG. 5, between the first electrode 310, 320 and 330 and the circuit device layer 200. The first electrode 310, 320 and 330 may be directly provided on the auxiliary electrode 340, 350 and 360 in an emission area (EA), and may be electrically connected with the auxiliary electrode 340, 350 and 360. And, the auxiliary electrode 340, 350 and 360 may be connected with the source terminal or drain terminal of the driving thin film transistor (TFT) via the contact hole (CH) provided in the circuit device layer 200. Accordingly, the high potential voltage may be applied from the source terminal or drain terminal of the driving thin film transistor (TFT) to the first electrode 310, 320 and 330 through the auxiliary electrode 340, 350 and 360 and the contact hole (CH).

The first electrode 310 of the first sub pixel (P1) is connected with the source terminal or drain terminal of the driving thin film transistor (TFT) through the auxiliary electrode 340 and the contact hole (CH), whereby the first high potential voltage is applied to the first electrode 310 of the first sub pixel (P1). The first electrode 320 of the second sub pixel (P2) is connected with the source terminal or drain terminal of the driving thin film transistor (TFT) through the auxiliary electrode 350 and the contact hole (CH), whereby the second high potential voltage is applied to the first electrode 320 of the second sub pixel (P2). The first electrode 330 of the third sub pixel (P3) is connected with the source terminal or drain terminal of the driving thin film transistor (TFT) through the auxiliary electrode 360 and the contact hole (CH), whereby the third high potential voltage is applied to the first electrode 330 of the third sub pixel (P3).

In FIG. 5, the auxiliary electrode 340, 350 and 360 is provided between the first electrode 310, 320 and 330 and the circuit device layer 200, but not necessarily. According to another embodiment of the present disclosure, it is possible to omit the auxiliary electrode 340, 350 and 360. In this case, the first electrode 310, 320 and 330 may be connected with the source terminal or drain terminal of the driving thin film transistor (TFT) via the contact hole (CH).

Meanwhile, the respective first electrodes 310, 320 and 330 formed in the sub pixels (P1, P2, P3) may have different sizes. In more detail, a size in each of the first electrode 310 of the first sub pixel (P1) and the first electrode 330 of the third sub pixel (P3) may be larger than a size in the first electrode 320 of the second sub pixel (P2). A width (W4) in the first electrode 310 of the first sub pixel (P1) and a width (W6) in the first electrode 330 of the third sub pixel (P3) may be larger than a width (W5) in the first electrode 320 of the second sub pixel (P2). For example, the first electrode 310 of the first sub pixel (P1) and the first electrode 330 of the third sub pixel (P3) may be formed on a lateral surface of the bank 370 as well as an upper surface of the circuit device layer 200. Meanwhile, the first electrode 320 of the second sub pixel (P2) may be formed only on the upper surface of the circuit device layer 200, as shown in FIG. 5, but not limited to this structure. The first electrode 320 of the second sub pixel (P2) may be formed on the upper surface of the circuit device layer 200 and the lateral surface of the bank 370. In this case, the size in the first electrode 320 of the second sub pixel (P2) has to be smaller than the size in each of the first electrode 310 of the first sub pixel (P1) and the first electrode 330 of the third sub pixel (P3), whereby the size in the first electrode 320 of the second sub pixel (P2) on the lateral surface of the bank 370 is smaller than the size in the first electrode 310 of the first sub pixel (P1) on the lateral surface of the bank 370 or the size in the first electrode 330 of the third sub pixel (P3) on the lateral surface of the bank 370.

The first electrode 310, 320 and 330 defines the emission area (EA) in each of the first, second, and third sub pixels (P1, P2, P3). That is, some area of each sub pixel (P1, P2, P3), in which the first electrode 310, 320 and 330 is formed, becomes the emission area (EA). Meanwhile, the remaining area of each sub pixel (P1, P2, P3), in which the first electrode 310, 320 and 330 is not formed, becomes an non-emission area.

Thus, the size in the first electrode 320 of the second sub pixel (P2) is smaller than the size in each of the first electrode 310 of the first sub pixel (P1) and the first electrode 330 of the third sub pixel (P3), whereby a size of the emission area (EA) of the second sub pixel (P2) is smaller than a size of the emission area (EA) in each of the first and third sub pixels (P1, P3).

The first electrode 310, 320 and 330 may be formed of a transparent metal material, a semi-transmissive metal material, or a metal material with high reflectance. If the display device 100 is formed in the top emission type, the first electrode 310, 320 and 330 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. If the display device 100 is formed in the bottom emission type, the first electrode 310, 320 and 330 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 310, 320 and 330 may be the anode electrode.

The bank 370 may be provided to cover an end of each auxiliary electrode 340, 350 and 360 on the circuit device layer 200. Accordingly, it is possible to prevent a current from being concentrated on the end of the auxiliary electrode 340, 350 and 360, to thereby prevent a problem related with a deterioration of an emission efficiency.

Also, the bank 370 is connected from the end of one auxiliary electrode 340 to the end of another auxiliary electrode 350, and may be connected from the end of another auxiliary electrode 350 to the end of another auxiliary electrode 360. That is, the bank 370 covers the end of each auxiliary electrode 340, 350 and 360, and also covers the circuit device layer 200.

The bank 370 may be formed of an inorganic insulating film with a relatively small thickness, but not limited to this structure. The bank 370 may be formed of an organic insulating film with a relatively large thickness.

The first emission layer 400 is patterned by each sub pixel (P1, P2, P3) on the first electrode 300. The first emission layer 400 may be formed on the bank 370. One of the first emission layer 410 is formed on the first electrode 310 of the first sub pixel (P1), another first emission layer 420 is formed on the first electrode 320 of the second sub pixel (P2), and another first emission layer 430 is formed on the first electrode 330 of the third sub pixel (P3).

As shown in FIG. 5, a size in the first emission layer 410 of the first sub pixel (P1) may be smaller than a size of the first electrode 310. Accordingly, in case of the first sub pixel (P1), the peripheral areas of the first electrode 310 are exposed without being covered by the first emission layer 410.

As shown in FIG. 5, a size in the first emission layer 430 of the third sub pixel (P3) may be smaller than a size of the first electrode 330. Accordingly, in case of the third sub pixel (P3), the peripheral areas of the first electrode 330 may be exposed without being covered by the first emission layer 430.

As shown in FIG. 5, a size in the first emission layer 420 of the second sub pixel (P2) is larger than a size of the first electrode 320. Accordingly, in case of the second sub pixel (P2), the first electrode 320 is covered by the first emission layer 420.

In this case, a size in the first emission layer 420 of the second sub pixel (P2) is identical to a size in each of the first emission layer 410 of the first sub pixel (P1) and the first emission layer 430 of the third sub pixel (P3). However, a size in the first electrode 320 of the second sub pixel (P2) is smaller than a size in each of the first electrode 310 of the first sub pixel (P1) and the first electrode 330 of the third sub pixel (P3). Accordingly, unlike the first and third sub pixels (P1, P3), the first electrode 320 of the second sub pixel (P2) is covered by the first emission layer 420.

The first emission layer 410, 420 and 430 may comprise a hole transporting layer, a light emitting layer, and an electron transporting layer. In the first emission layer 410, 420 and 430, hole and electron are respectively transferred to the light emitting layer through the hole transporting layer and the electron transporting layer, and then the hole and electron are bonded to each other in the light emitting layer, to thereby emit light with a predetermined color.

The first emission layer 410, 420 and 430 may be any one among a red emitting layer configured to emit red colored light, a green emitting layer configured to emit green colored light, a blue emitting layer configured to emit blue colored light, and a yellow emitting layer configured to emit yellow colored light, but not limited to these types.

The second electrode 500 is patterned by each sub pixel (P1, P2, P3) on the first emission layer 400. The second electrode 500 may be formed on the bank 370. One of the second electrode 510 is formed on the first emission layer 410 of the first sub pixel (P1), another second electrode 520 is formed on the first emission layer 420 of the second sub pixel (P2), and another second electrode 530 is formed on the first emission layer 430 of the third sub pixel (P3).

The second electrode 510 of the first sub pixel (P1) is formed in the area of the first electrode 310. As shown in FIGS. 4 and 5, a size in the second electrode 510 of the first sub pixel (P1) may be smaller than a size of the first electrode 310. That is, the second electrode 510 of the first sub pixel (P1) may have the width (W1) which is smaller than the width (W4) of the first electrode 310, but not limited to this structure. The second electrode 510 of the first sub pixel (P1) may be identical in size to the first electrode 310.

Also, the size in the second electrode 510 of the first sub pixel (P1) may be larger than the size of the first emission layer 410. Accordingly, in case of the first sub pixel (P1), the second electrode 510 is in contact with the periphery of the first electrode 310 which is exposed without being covered by the first emission layer 410. In the first sub pixel (P1), there is a first contact area (CA1) where the first electrode 310 is in contact with the second electrode 510.

In the first sub pixel (P1), the second electrode 510 is in direct contact with the first electrode 310, whereby the second electrode 510 and the first electrode 310 are electrically connected with each other. That is, when the first high potential voltage is applied to the first electrode 310 of the first sub pixel (P1), the first high potential voltage which is the same as that of the first electrode 310 may be identically applied to the second electrode 510 of the first sub pixel (P1). In this case, the second electrode 510 of the first sub pixel (P1) may be the anode electrode.

The second electrode 530 of the third sub pixel (P3) is formed in the area of the first electrode 330. As shown in FIGS. 4 and 5, a size in the second electrode 530 of the third sub pixel (P3) may be smaller than a size of the first electrode 330. That is, the second electrode 530 of the third sub pixel (P3) may have the width (W3) which is smaller than the width (W6) of the first electrode 330, but not limited to this structure. The second electrode 530 of the third sub pixel (P3) may be identical in size to the first electrode 330.

Also, the size in the second electrode 530 of the third sub pixel (P3) may be larger than the size of the first emission layer 430. Accordingly, in case of the third sub pixel (P3), the second electrode 530 is in contact with the periphery of the first electrode 330 which is exposed without being covered by the first emission layer 430. In the third sub pixel (P3), there is a second contact area (CA2) where the first electrode 330 is in contact with the second electrode 530.

In the third sub pixel (P3), the second electrode 530 is in direct contact with the first electrode 330, whereby the second electrode 530 and the first electrode 330 are electrically connected with each other. That is, when the third high potential voltage is applied to the first electrode 330 of the third sub pixel (P3), the third high potential voltage which is the same as that of the first electrode 330 may be identically applied to the second electrode 530 of the third sub pixel (P3). In this case, the second electrode 530 of the third sub pixel (P3) may be the anode electrode.

As shown in FIGS. 4 and 5, a size in the second electrode 520 of the second sub pixel (P2) may be larger than a size of the first emission layer 420 and the first electrode 320. The second electrode 520 of the second sub pixel (P2) may have the width (W2) which is larger than the width (W5) of the first electrode 320. Unlike the first and third sub pixels (P1, P3), the second sub pixel (P2) is provided with the first electrode 320 which is covered by the first emission layer 420, whereby the second electrode 520 formed on the first emission layer 420 is not in contact with the first electrode 320. That is, the second electrode 520 of the second sub pixel (P2) may be insulated from the first electrode 320 by the use of first emission layer 420.

Meanwhile, the second electrode 520 of the second sub pixel (P2) may extend from the display area (DA) to the pad (PAD) disposed in the pad area (PA).

In more detail, the first to third sub pixels (P1, P2, P3) are arranged along a first direction (X-axis direction), and an arrangement structure comprising the first to third sub pixels (P1, P2, P3) arranged in the first direction is repetitively provided along a second direction (Y-axis direction).

The first substrate 111 may include a first sub pixel area (SPA1) provided with the plurality of first sub pixels (P1) along the second direction (Y-axis direction). The second electrode 510 disposed in the first sub pixel area (SPA1) is patterned in each of the plurality of first sub pixels (P1) along the second direction (Y-axis direction). The second electrode 510 disposed in the first sub pixel area (SPA1) is electrically connected with the first electrode 310, and the second electrode 510 disposed in the first sub pixel area (SPA1) is used as the anode electrode.

The first substrate 111 may include a third sub pixel area (SPA3) provided with the plurality of third sub pixels (P3) along the second direction (Y-axis direction). The second electrode 530 disposed in the third sub pixel area (SPA3) is patterned in each of the plurality of third sub pixels (P3) along the second direction (Y-axis direction). The second electrode 530 disposed in the third sub pixel area (SPA3) is electrically connected with the first electrode 330, and the second electrode 530 disposed in the third sub pixel area (SPA3) is used as the anode electrode.

Meanwhile, the first substrate 111 may include a second sub pixel area (SPA2) provided with the plurality of second sub pixels (P2) along the second direction (Y-axis direction). The second electrode 520 disposed in the second sub pixel area (SPA2) extends along the plurality of second sub pixels (P2) in the second direction (Y-axis direction), as shown in FIG. 3. In this case, the second electrode 520 disposed in the second sub pixel area (SPA2) extends from the display area (DA) to the pad (PAD) disposed in the pad area (PA), and is in contact with the pad (PAD). That is, the second electrode 520 of the second sub pixel (P2) may be applied with the low potential voltage from the pad (PAD). In this case, the second electrode 520 of the second sub pixel (P2) may be the cathode electrode.

The second electrode 510, 520 and 530 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag).

The second emission layer 600 is formed on the second electrode 510, 520 and 530. Unlike the first emission layer 410, 420 and 430, the second emission layer 600 is connectedly provided between the neighboring sub pixels (P1, P2, P3). That is, the second emission layer 600 is not patterned by each sub pixel (P1, P2, P3), but formed on the entire display area (DA).

The second emission layer 600 may comprise a hole transporting layer, a light emitting layer, and an electron transporting layer. In the second emission layer 600, hole and electron are respectively transferred to the light emitting layer through the hole transporting layer and the electron transporting layer, and then the hole and electron are bonded to each other in the light emitting layer, to thereby emit light with a predetermined color.

The second emission layer 600 may be any one among a red emitting layer configured to emit red colored light, a green emitting layer configured to emit green colored light, a blue emitting layer configured to emit blue colored light, and a yellow emitting layer configured to emit yellow colored light, but not limited to these types.

The second emission layer 600 may emit light with a color which is different from that of the first emission layer 410, 420 and 430. If the first emission layer 410, 420 and 430 is the emission layer configured to emit first colored light, the second emission layer 600 may be the emission layer configured to emit second colored light which is different from the first colored light. For example, the first emission layer 410, 420 and 430 may be the blue emitting layer configured to emit blue colored light, and the second emission layer 600 may be the yellow emitting layer configured to emit yellow colored light.

The third electrode 700 is formed on the second emission layer 600. The third electrode 700 is not patterned by each sub pixel (P1, P2, P3), but formed on the entire display area (DA). The third electrode 700 extends from the display area (DA) to the pad area (PA). As shown in FIGS. 6 and 7, the third electrode 700 may be in contact with the pad (PAD) or second electrode 520. The third electrode 700 may be the cathode electrode.

The third electrode 700 may be formed of a transparent metal material, a semi-transmissive metal material, or a metal material with high reflectance. If the display device 100 is formed in the top emission type, the third electrode 700 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the third electrode 700 may be formed of a metal material with high reflectance, and more particularly, a deposition structure of aluminum and titanium (Ti/Al/Ti), a deposition structure of aluminum and Indium Tin Oxide (ITO/Al/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc.

The encapsulation layer 800 may cover the third electrode 700. The encapsulation layer 800 prevents oxygen or moisture from being permeated into the first emission layer 400, the second electrode 500, the second emission layer 600, and the third electrode 700. To this end, the encapsulation layer 800 may include at least one inorganic film and at least one organic film.

In detail, the encapsulation layer 800 may include a first inorganic film and an organic film. According to one embodiment of the present disclosure, the encapsulation layer 800 may further include a second inorganic film.

The first inorganic film may cover the third electrode 700. The organic film is provided on the first inorganic film. Preferably, the organic film has a length which is sufficient to prevent particles from being permeated into the first emission layer 400, the second electrode 500, the second emission layer 600, and the third electrode 700 through the first inorganic film. The second inorganic film is provided to cover the organic film.

Each of the first inorganic film and the second inorganic film may be formed of silicon nitride, aluminum nitride, zirconium nitride, titanium nitride, hafnium nitride, tantalum nitride, silicon oxide, aluminum oxide, or titanium oxide. The first and second inorganic films may be deposited by a chemical vapor deposition (CVD) method or an atomic layer deposition (ALD) method, but not limited to these methods.

The organic film may be formed of acryl resin, epoxy resin, phenolic resin, polyamide resin, or polyimide resin. The organic film may be manufactured by a vapor deposition method, a printing method, or a slit coating method, but not limited to these methods. The organic film may be manufactured by an ink-jet method.

The display device 100 according to one embodiment of the present disclosure may further include a color filter 900 which is configured to emit different colored light in each of the first sub pixel (P1) and the third sub pixel (P3).

The color filter 900 may include a first color filter (CF1) corresponding to the first sub pixel (P1), and a second color filter (CF2) corresponding to the third sub pixel (P3). Each of the first color filter (CF1) and the second color filter (CF2) may transmit different colored light therethrough.

For example, the first color filter (CF1) may be a red color filter for transmitting red colored light therethrough, and the second color filter (CF2) may be a green color filter for transmitting green colored light therethrough. Accordingly, the first sub pixel (P1) emits the red colored light, and the third sub pixel (P3) emits the green colored light.

The color filter 900 may be disposed on the encapsulation layer 800 or may be disposed below the first electrode 310, 320 and 330 in accordance with a light emission type of the display device 100. If the display device 100 is in the top emission type, the color filter 900 may be disposed on the encapsulation layer 800, as shown in FIG. 5. If the display device 100 is in the bottom emission type, the color filter 900 may be disposed between the first electrode 310, 320 and 330 and the first substrate 111.

The display device according to one embodiment of the present disclosure is embodied in that any one of the first emission layer 410, 420 and 430 and the second emission layer 600 emits light in each sub pixel (P1, P2, P3).

In more detail, in case of the first sub pixel (P1), the light emission is generated in the second emission layer 600. In the first sub pixel (P1), the second electrode 510 is in contact with the first electrode 310, whereby the second electrode 510 is electrically connected with the first electrode 310. When the first high potential voltage is applied to the first electrode 310 of the first sub pixel (P1), the first high potential voltage which is the same as that of the first electrode 310 may be identically applied to the second electrode 510 of the first sub pixel (P1). Accordingly, in case of the first sub pixel (P1), the light emission is not generated in the first emission layer 410 provided between the first electrode 310 and the second electrode 510.

Meanwhile, in case of the first sub pixel (P1), when the first high potential voltage is applied to the second electrode 510, and the low potential voltage is applied to the third electrode 700, the second emission layer 600 provided between the second electrode 510 and the third electrode 700 emits light with a predetermined brightness in accordance with a predetermined current.

In the third sub pixel (P3), the light emission is generated in the second emission layer 600. In case of the third sub pixel (P3), the second electrode 530 is in contact with the first electrode 330, whereby the second electrode 530 and the first electrode 330 are electrically connected with each other. When the third high potential voltage is applied to the first electrode 330 of the third sub pixel (P3), the third high potential voltage which is the same as that of the first electrode 330 may be identically applied to the second electrode 530 of the third sub pixel (P3). Accordingly, in case of the third sub pixel (P3), the light emission is not generated in the first emission layer 430 provided between the first electrode 330 and the second electrode 530.

Meanwhile, in case of the third sub pixel (P3), when the third high potential voltage is applied to the second electrode 530, and the low potential voltage is applied to the third electrode 700, the second emission layer 600 provided between the second electrode 530 and the third electrode 700 emits light with a predetermined brightness in accordance with a predetermined current.

That is, the same colored light is emitted from both the second emission layer 600 of the first sub pixel (P1) and the second emission layer 600 of the third sub pixel (P3). In the display device according to one embodiment of the present disclosure, the first sub pixel (P1) and the third sub pixel (P3) respectively emit the different colored light through the use of color filter 900. For example, the first sub pixel (P1) emits red colored light through the use of red color filter, and the third sub pixel (P3) emits green colored light through the use of green color filter.

In case of the second sub pixel (P2), the light emission is generated in the first emission layer 420. In the second sub pixel (P2), the second electrode 520 is in contact with the pad (PAD), and the third electrode 700 is in contact with the second electrode 520. When the low potential voltage is applied from the pad (PAD) to the second electrode 520 of the second sub pixel (P2), the low potential voltage which is the same as that of the second electrode 520 is applied to the third electrode 700. Accordingly, in case of the second sub pixel (P2), the light emission is not generated in the second emission layer 600 provided between the second electrode 520 and the third electrode 700.

Meanwhile, in case of the second sub pixel (P2), when the second high potential voltage is applied to the first electrode 320, and the low potential voltage is applied to the second electrode 520, the first emission layer 420 provided between the first electrode 320 and the second electrode 520 emits light with a predetermined brightness in accordance with a predetermined current.

For example, the first emission layer 420 may be the blue emitting layer configured to emit the blue colored light. In this case, the display device 100 may realize a blue sub pixel without providing an additional color filter at a position corresponding to the second sub pixel (P2).

As described above, in the display device 100 according to one embodiment of the present disclosure, only the second emission layer 600 emits light in the first sub pixel (P1) and the third sub pixel (P3), and only the first emission layer 420 emits light in the second sub pixels (P2). Thus, in comparison to a case of making the first emission layer 410, 420 and 430 and the second emission layer 600 emit light in all the sub pixels, the display device 100 according to one embodiment of the present disclosure enables remarkably-reduced power consumption.

Figure 8:
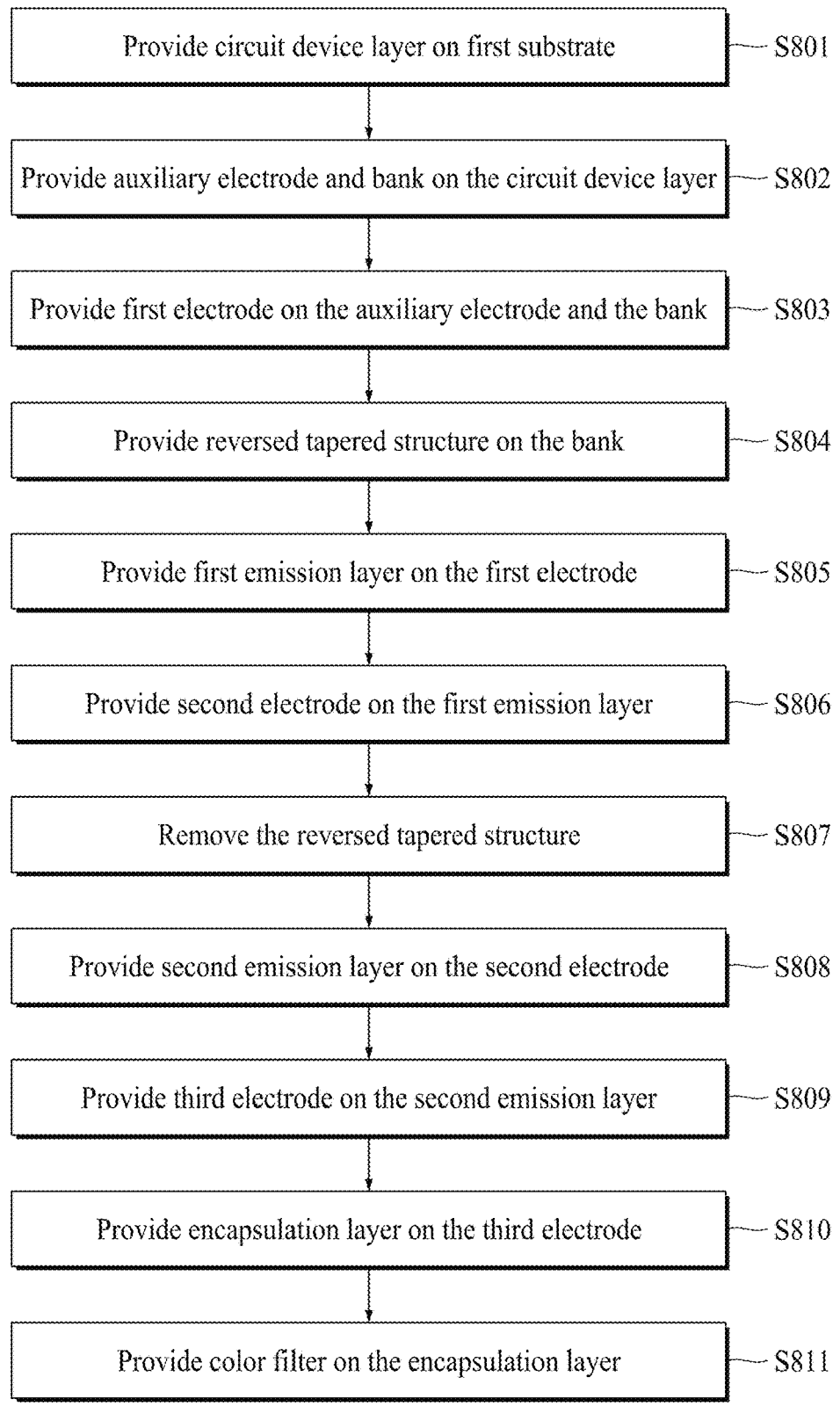
FIG. 8 is a flow chart illustrating a method for manufacturing the display device according to one embodiment of the present disclosure.

FIG. 8 is a flow chart illustrating a method for manufacturing the display device according to one embodiment of the present disclosure. FIGS. 9A to 9K are cross sectional views illustrating a method for manufacturing the display device according to one embodiment of the present disclosure.

Figure 9A:
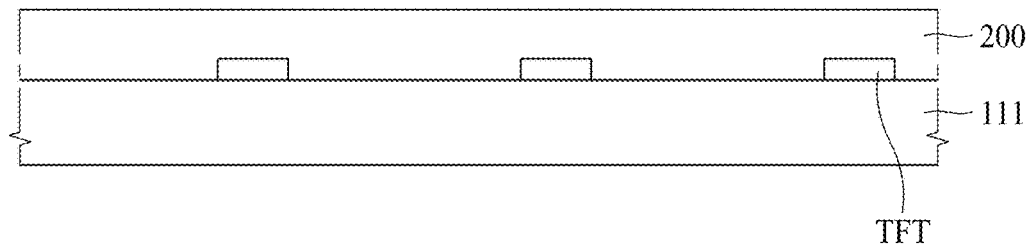
FIGS. 9A to 9K are cross sectional views illustrating a method for manufacturing the display device according to one embodiment of the present disclosure.

First, as shown in FIG. 9A, the circuit device layer 200 is formed on the first substrate 111 (S801).

In more detail, the driving thin film transistor (TFT) is formed on the first substrate 111. An active layer is formed on the first substrate 111. The active layer may be formed of a silicon-based semiconductor material or an oxide-based semiconductor material.

A gate insulating film may be formed on the active layer. The gate insulating film may be formed in a single-layered structure of an inorganic insulating material such as silicon oxide (SiOx) or silicon nitride (SiNx), or a multi-layered structure of the above silicon oxide (SiOx) and silicon nitride (SiNx).

A gate electrode may be formed on the gate insulating film. The gate electrode may be formed in a single-layered structure of any one material selected among molybdenum (Mo), aluminum (Al), chrome (Cr), aurum (Au), titanium (Ti), nickel (Ni), neodymium (Nd), copper (Cu) and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these types.

An insulating interlayer may be formed on the gate electrode. The insulating interlayer may be formed in a single-layered structure of an inorganic insulating material such as silicon oxide (SiOx) or silicon nitride (SiNx), or a multi-layered structure of the above silicon oxide (SiOx) and silicon nitride (SiNx).

Source and drain electrodes may be formed on the insulating interlayer. Each of the source and drain electrodes may be connected with the active layer via a contact hole penetrating through the gate insulating film and the insulating interlayer. Each of the source and drain electrodes may be formed in a single-layered structure of any one material selected among molybdenum (Mo), aluminum (Al), chrome (Cr), aurum (Au), titanium (Ti), nickel (Ni), neodymium (Nd), copper (Cu) and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu) and their alloys, but not limited to these types.

A protection film may be formed on the source and drain electrodes. The protection film may be formed in a single-layered structure of an inorganic insulating material such as silicon oxide (SiOx) or silicon nitride (SiNx), or a multi-layered structure of the above silicon oxide (SiOx) and silicon nitride (SiNx).

A planarization film may be formed on the protection film. The planarization film may be formed of an organic film, for example, acryl resin, epoxy resin, phenolic resin, polyamide resin, polyimide resin, and etc.

Figure 9B:
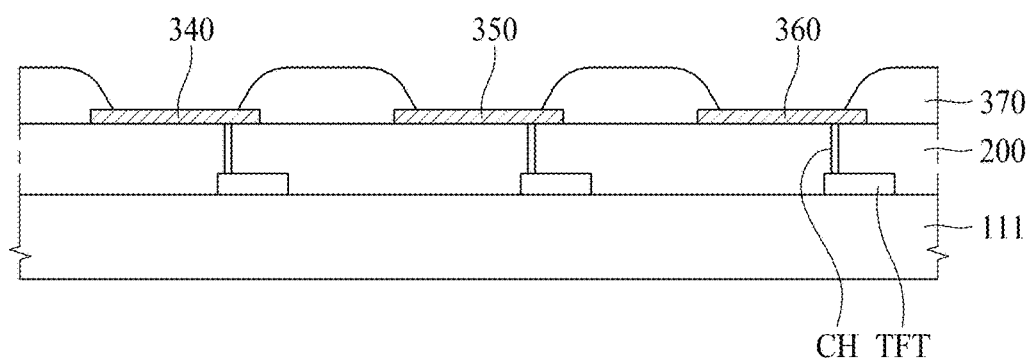

Then, as shown in FIG. 9B, the auxiliary electrode 340, 350 and 360 and the bank 370 are formed (S802).

In more detail, the auxiliary electrode 340, 350 and 360 may be patterned by each sub pixel (P1, P2, P3) on the circuit device layer 200. The auxiliary electrode 340, 350 and 360 may be connected with the source electrode or drain electrode of the driving thin film transistor (TFT) via the contact hole (CH). If needed, it is possible to omit the auxiliary electrode 340, 350 and 360.

Thereafter, the bank 370 is provided to cover the end of each auxiliary electrode 340, 350 and 360. The bank 370 may be formed of the inorganic insulating film with a relatively small thickness, but not limited to this structure. The bank 370 may be formed of the organic insulating film with a relatively large thickness.

Figure 9C:
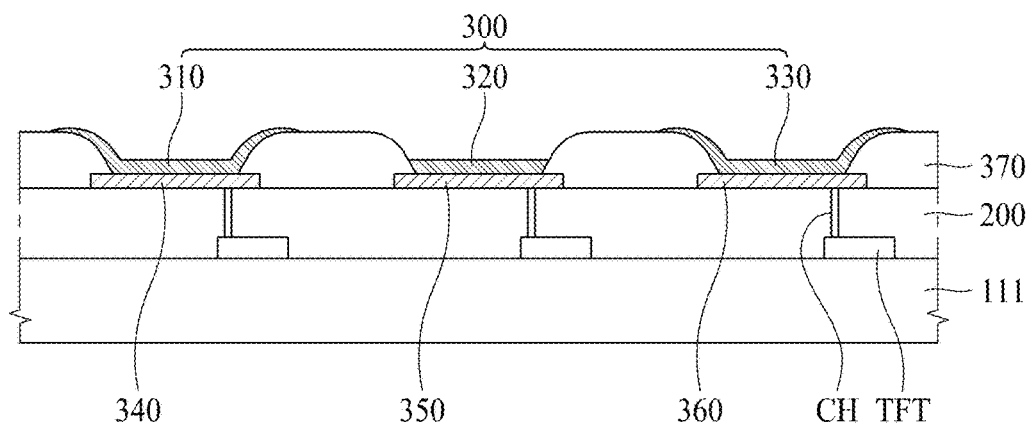

Then, as shown in FIG. 9C, the first electrode 310, 320 and 330 may be formed (S803).

In more detail, the first electrode 310, 320 and 330 may be patterned by each sub pixel (P1, P2, P3) on the auxiliary electrode 340, 350 and 360 and the bank 370. In this case, the first electrode 310, 320 and 330 may have the different size by each sub pixel (P1, P2, P3).

The size in each of the first electrode 310 of the first sub pixel (P1) and the first electrode 330 of the third sub pixel (P3) may be larger than the size in the first electrode 320 of the second sub pixel (P2). For example, the first electrode 310 of the first sub pixel (P1) and the first electrode 330 of the third sub pixel (P3) may be formed on the lateral surface of the bank 370 as well as the upper surface of the circuit device layer 200.

Meanwhile, the first electrode 320 of the second sub pixel (P2) may be formed only on the upper surface of the circuit device layer 200, but not limited to this structure. The first electrode 320 of the second sub pixel (P2) may be formed on the upper surface of the circuit device layer 200 and the lateral surface of the bank 370. In this case, the size in the first electrode 320 of the second sub pixel (P2) has to be smaller than the size in each of the first electrode 310 of the first sub pixel (P1) and the first electrode 330 of the third sub pixel (P3), whereby the size in the first electrode 320 of the second sub pixel (P2) on the lateral surface of the bank 370 is smaller than the size in the first electrode 310 of the first sub pixel (P1) on the lateral surface of the bank 370 or the size in the first electrode 330 of the third sub pixel (P3) on the lateral surface of the bank 370.

The first electrode 310, 320 and 330 may be formed of a transparent metal material, a semi-transmissive metal material, or a metal material with high reflectance. If the display device 100 is formed in the top emission type, the first electrode 310, 320 and 330 may be formed of a metal material with high reflectance, and more particularly, a deposition structure of aluminum and titanium (Ti/Al/Ti), a deposition structure of aluminum and Indium Tin Oxide (ITO/AL/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. If the display device 100 is formed in the bottom emission type, the first electrode 310, 320 and 330 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). The first electrode 310, 320 and 330 may be the anode electrode.

The first electrode 310, 320 and 330 may be formed by a physics vapor deposition such as sputtering.

Figure 9D:
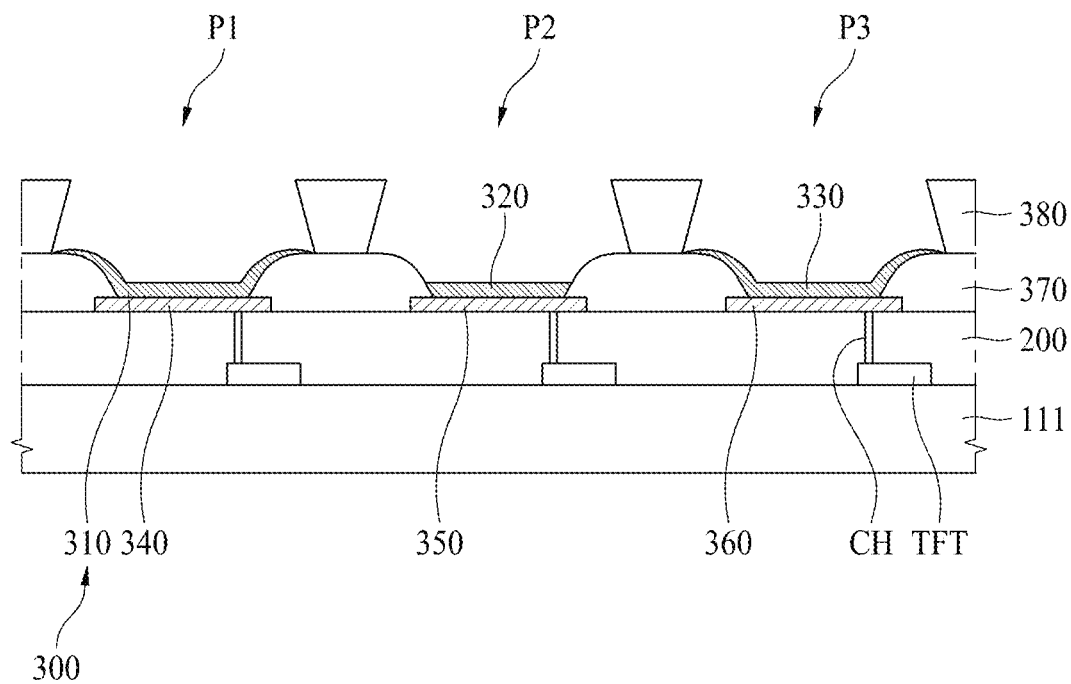

Then, as shown in FIG. 9D, a reversed tapered structure 380 may be formed (S804). In more detail, the reverse tapered structure 380 with a relatively smaller lower surface in comparison to an upper surface is formed on the bank 370. In this case, the lower surface indicates the surface being in contact with the bank 370.

The reversed tapered structure 380 may be provided between each of the first electrodes 310, 320 and 330, but not limited to this structure. The reversed tapered structure 380 may be overlapped with the periphery of the first electrode 310, 320 and 330.

Figure 9E:
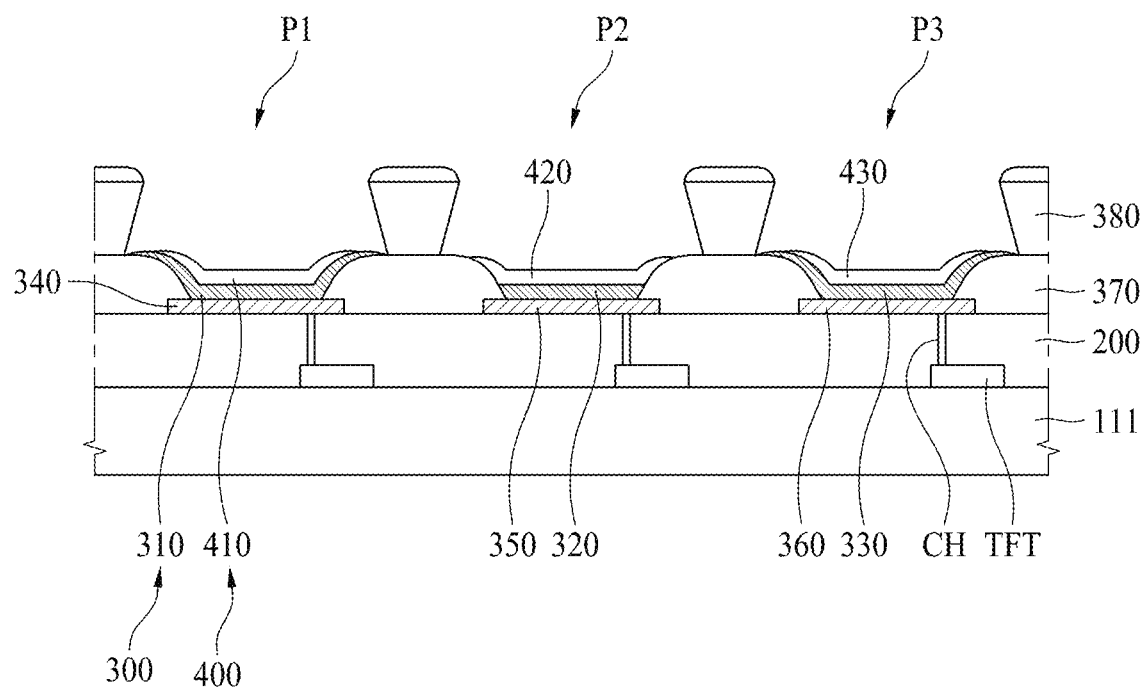

Then, as shown in FIG. 9E, the first emission layer 410, 420 and 430 may be formed (S805).

In more detail, the first emission layer 410, 420 and 430 is formed on the first electrode 310, 320 and 330 and the reversed tapered structure 380. The first emission layer 410, 420 and 430 may be formed by a deposition process or solution process. If the first emission layer 410, 420 and 430 is formed by the deposition process, an evaporation method may be used.

The first emission layer 410, 420 and 430 may be disconnectedly provided between each of the first sub pixel (P1), the second sub pixel (P2), and the third sub pixel (P3) through the use of reversed tapered structure 380. Also, the first emission layer 410 and 430 in each of the first and third sub pixels (P1, P3) may be not provided in the periphery of the first electrode 310 and 330 by the use of reversed tapered structure 380. Thus, the periphery of the first electrode 310 and 330 in each of the first and third sub pixels (P1, P3) may be exposed.

The first emission layer 410, 420 and 430 may be any one among the red emitting layer configured to emit the red colored light, the green emitting layer configured to emit the green colored light, the blue emitting layer configured to emit the blue colored light, and the yellow emitting layer configured to emit the yellow colored light, but not limited to these types.

Figure 9F:
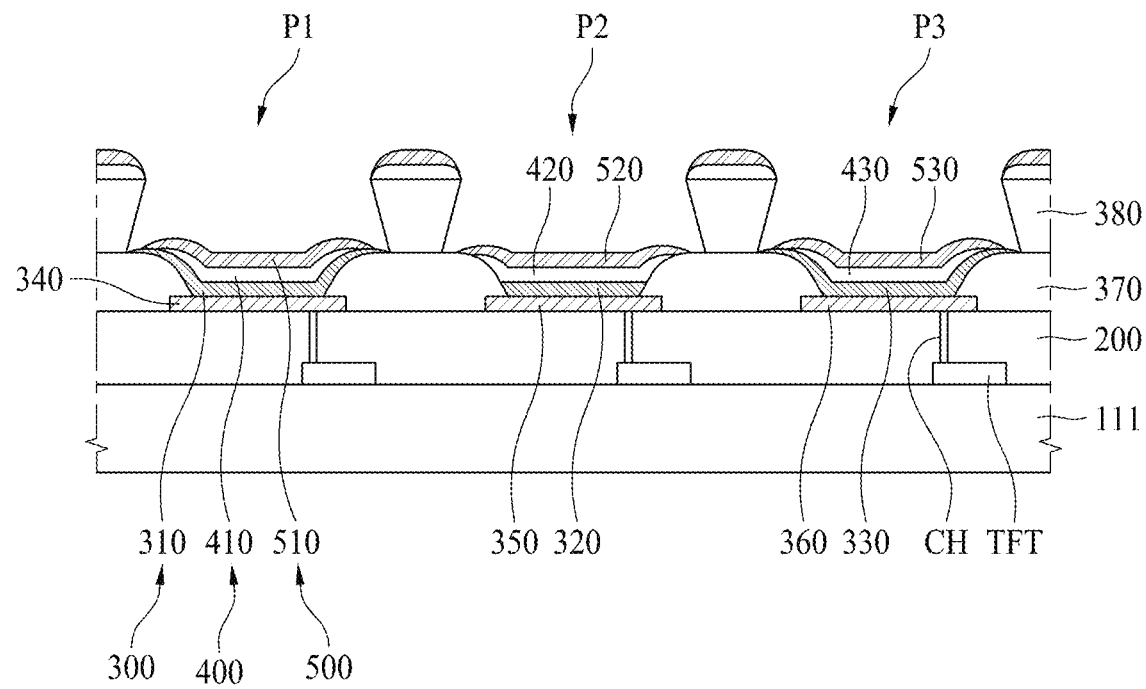

Then, as shown in FIG. 9F, the second electrode 510, 520 and 530 may be formed (S806).

In more detail, the second electrode 510, 520 and 530 is formed on the first emission layer 410, 420 and 430 and the reversed tapered structure 380. The second electrode 510, 520 and 530 may be formed by a physics vapor deposition such as sputtering. The film formed by the physics vapor deposition such as sputtering may have good step coverage properties. Thus, the second electrode 510, 520 and 530 may be formed with the relatively large area in comparison to the first emission layer 410, 420 and 430 formed by the evaporation method. Accordingly, in case of the first and third sub pixels (P1, P3), the second electrode 510 and 530 may be in contact with the first electrode 310 and 330 which is exposed without being covered by the first emission layer 410 and 430.

The second electrode 510, 520 and 530 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag).

Figure 9G:
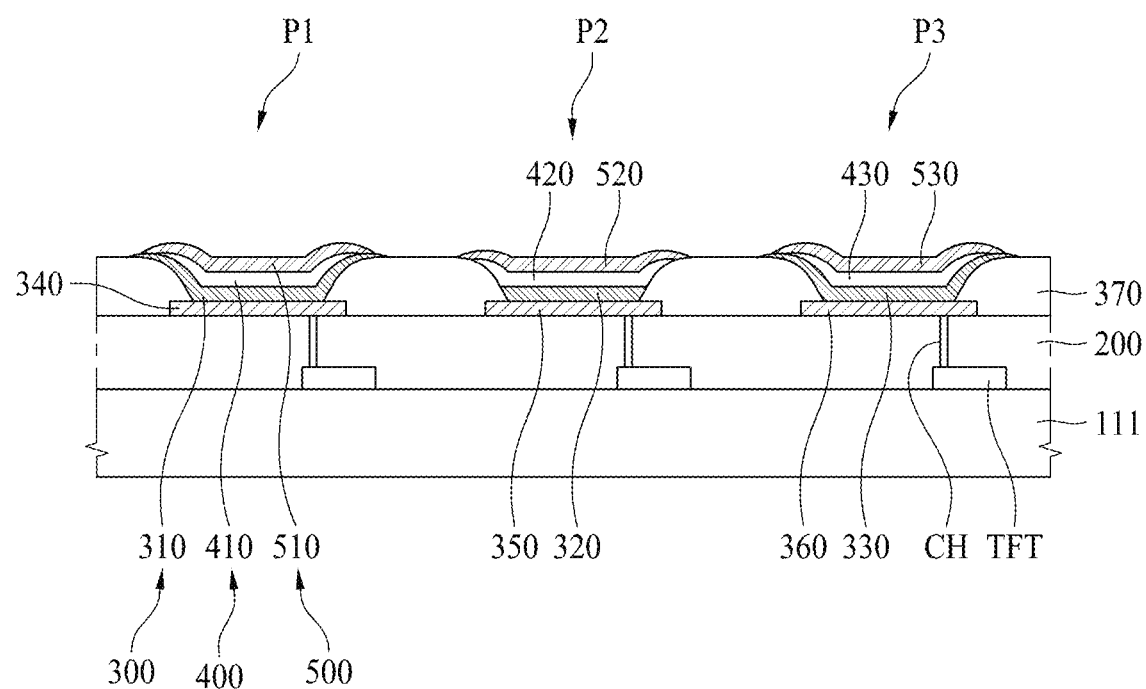

Then, as shown in FIG. 9G, the reversed tapered structure 380 may be removed (S807).

Figure 9H:
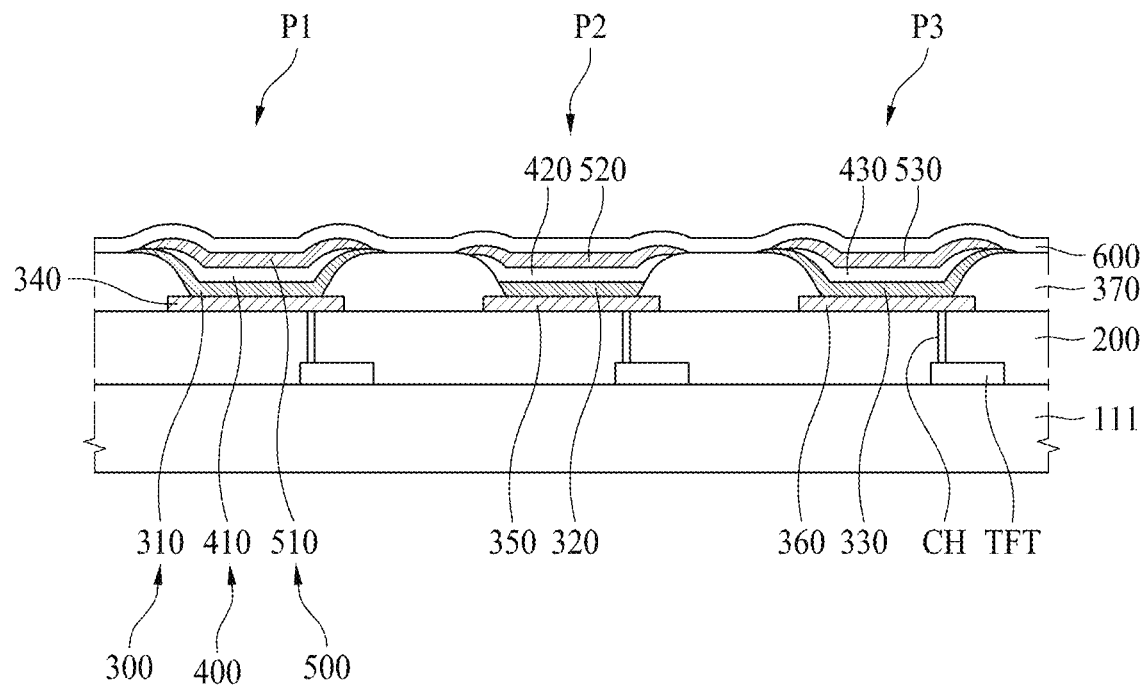

Then, as shown in FIG. 9H, the second emission layer 600 may be formed (S808).

In more detail, the second emission layer 600 is formed on the second electrode 510, 520 and 530. The second emission layer 600 may be formed by the deposition process or solution process. If the second emission layer 600 is formed by the deposition process, the evaporation method may be used.

The second emission layer 600 may be connectedly provided between each of the first sub pixel (P1), the second sub pixel (P2), and the third sub pixel (P3).

The second emission layer 600 may be any one among the red emitting layer configured to emit the red colored light, the green emitting layer configured to emit the green colored light, the blue emitting layer configured to emit the blue colored light, and the yellow emitting layer configured to emit the yellow colored light, but not limited to these types.

However, the second emission layer 600 may emit the light whose color is different from that of the first emission layer 410, 420 and 430. If the first emission layer 410, 420 and 430 is the emission layer configured to emit first colored light, the second emission layer 600 may be the emission layer configured to emit second colored light which is different from the first colored light. For example, the first emission layer 410, 420 and 430 may be the blue emitting layer configured to emit blue colored light, and the second emission layer 600 may be the yellow emitting layer configured to emit yellow colored light.

Figure 9I:
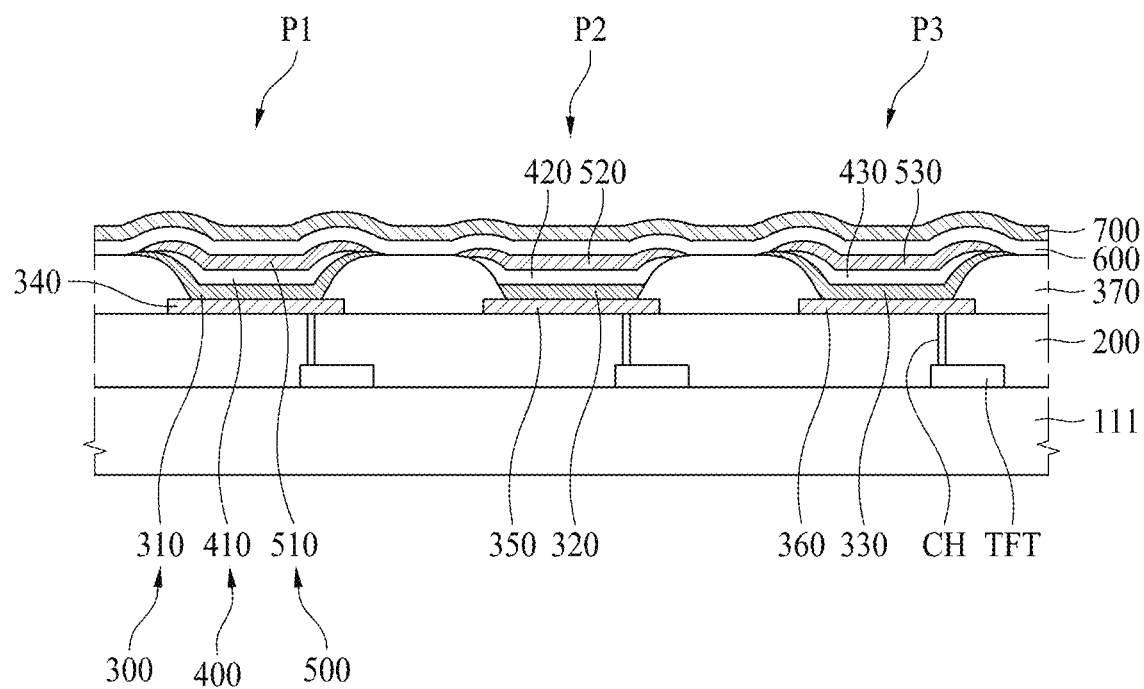

Then, as shown in FIG. 9I, the third electrode 700 may be formed (S809).

In more detail, the third electrode 700 is formed on the second emission layer 600. The third electrode 700 may be formed by the physics vapor deposition such as sputtering, or may be formed by the evaporation method.

The third electrode 700 may be formed of a transparent metal material, a semi-transmissive metal material, or a metal material with high reflectance. If the display device 100 is formed in the top emission type, the third electrode 700 may be formed of a transparent metal material (transparent conductive material, TCO) capable of transmitting light therethrough, for example, Indium Tin Oxide (ITO) or Indium Zinc Oxide (IZO), or may be formed of a semi-transmissive metal material (semi-transmissive conductive material), for example, magnesium (Mg), argentums (Ag), or alloy of magnesium (Mg) and argentums (Ag). If the display device 100 is formed in the bottom emission type, the third electrode 700 may be formed of a metal material with high reflectance, and more particularly, a deposition structure of aluminum and titanium (Ti/Al/Ti), a deposition structure of aluminum and Indium Tin Oxide (ITO/AL/ITO), an Ag alloy, and a deposition structure of Ag alloy and Indium Tin Oxide (ITO/Ag alloy/ITO). Herein, the Ag alloy is an alloy of argentums (Ag), palladium (Pd), copper, (Cu), and etc. The third electrode 700 may be the cathode electrode.

Figure 9J:
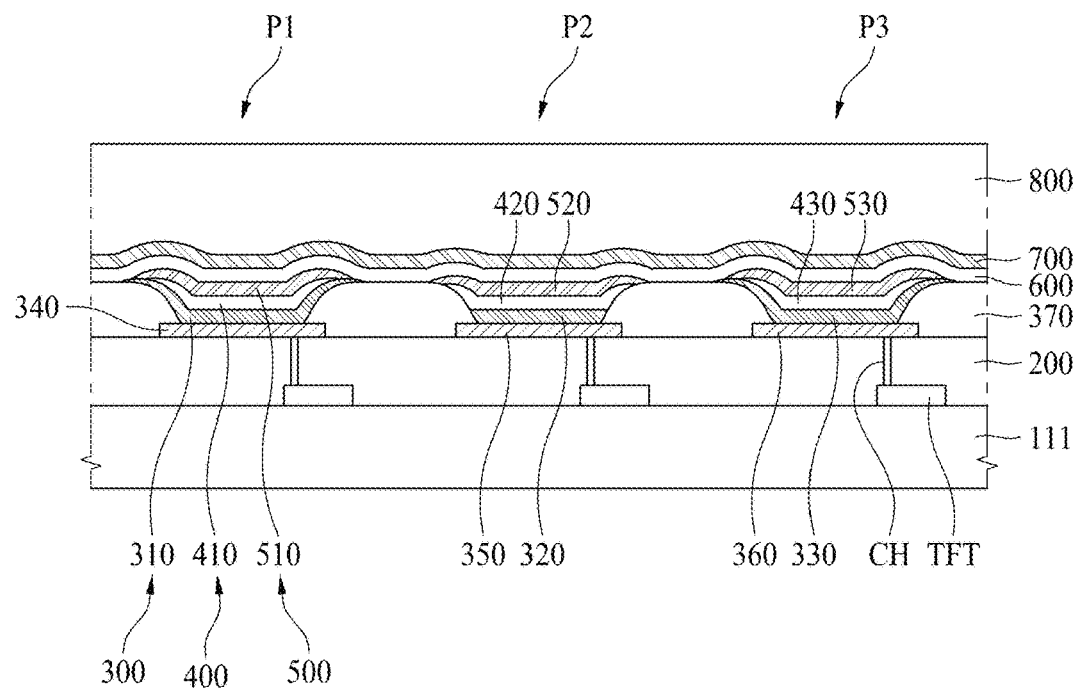

Then, as shown in FIG. 9J, the encapsulation layer 800 may be formed (S810).

In more detail, the encapsulation layer 800 is formed on the third electrode 700. The encapsulation layer 800 may include the first inorganic film, the organic film, and the second inorganic film. The first inorganic film may be formed on the third electrode 700. The first inorganic film may be formed of silicon nitride, aluminum nitride, zirconium nitride, titanium nitride, hafnium nitride, tantalum nitride, silicon oxide, aluminum oxide, or titanium oxide. The first inorganic film may be deposited by a chemical vapor deposition (CVD) method or an atomic layer deposition (ALD) method, but not limited to these methods.

Thereafter, the organic film may be formed on the first inorganic film. The organic film may be formed of acryl resin, epoxy resin, phenolic resin, polyamide resin, or polyimide resin.

Thereafter, the second inorganic film may be formed on the organic film. The second inorganic film may be formed of silicon nitride, aluminum nitride, zirconium nitride, titanium nitride, hafnium nitride, tantalum nitride, silicon oxide, aluminum oxide, or titanium oxide. The second inorganic film may be deposited by a chemical vapor deposition (CVD) method or an atomic layer deposition (ALD) method, but not limited to these methods.

Figure 9K:
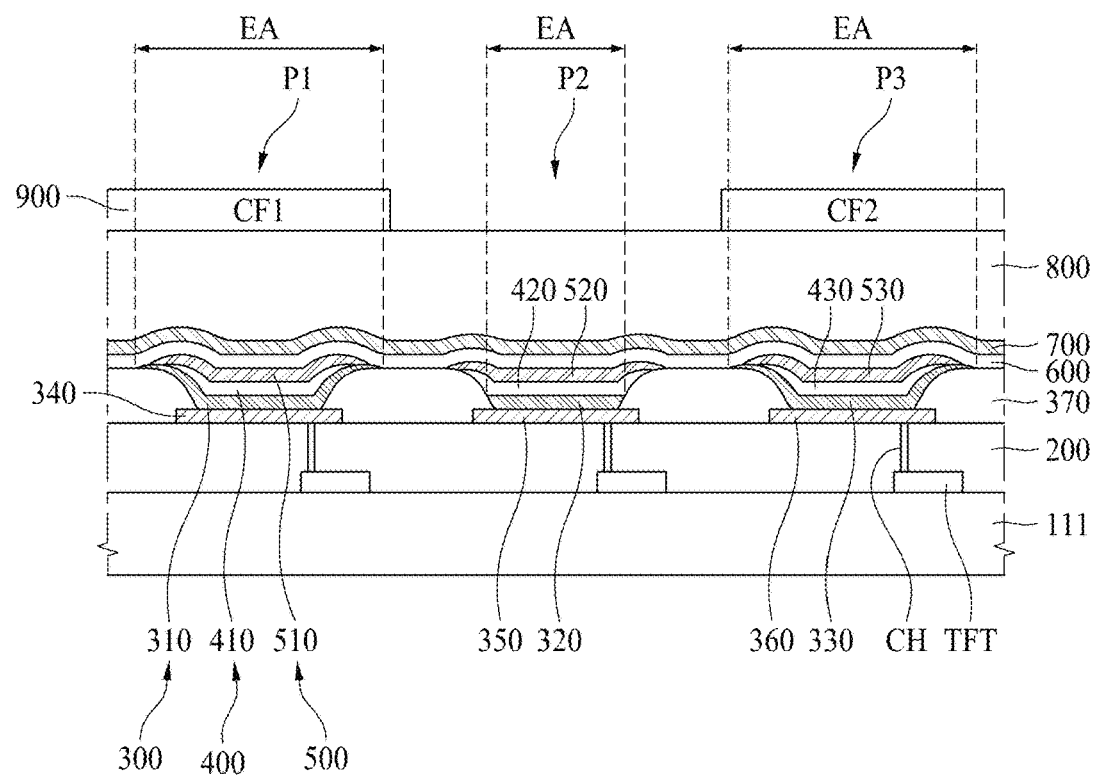

Then, as shown in FIG. 9K, the color filter 900 may be formed (S811).

In more detail, the first color filter (CF1) and the second color filter (CF2) are formed on the encapsulation layer 800. The first color filter (CF1) is disposed while being corresponding to the first sub pixel (P1), and the second color filter (CF2) is disposed while being corresponding to the third sub pixel (P3).

Figure 10A:
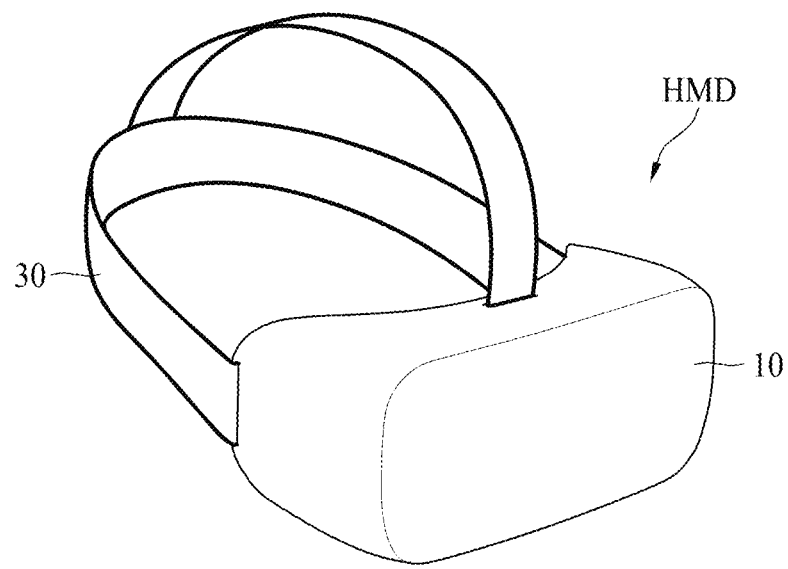
FIGS. 10A to 10C illustrate a display device according to another embodiment of the present disclosure, which relate to a head mounted display (HMD) device.
Figure 10B:
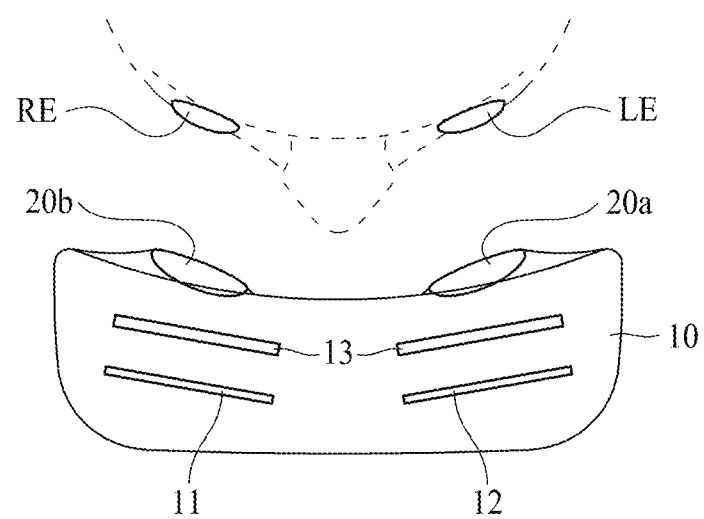
Figure 10C:
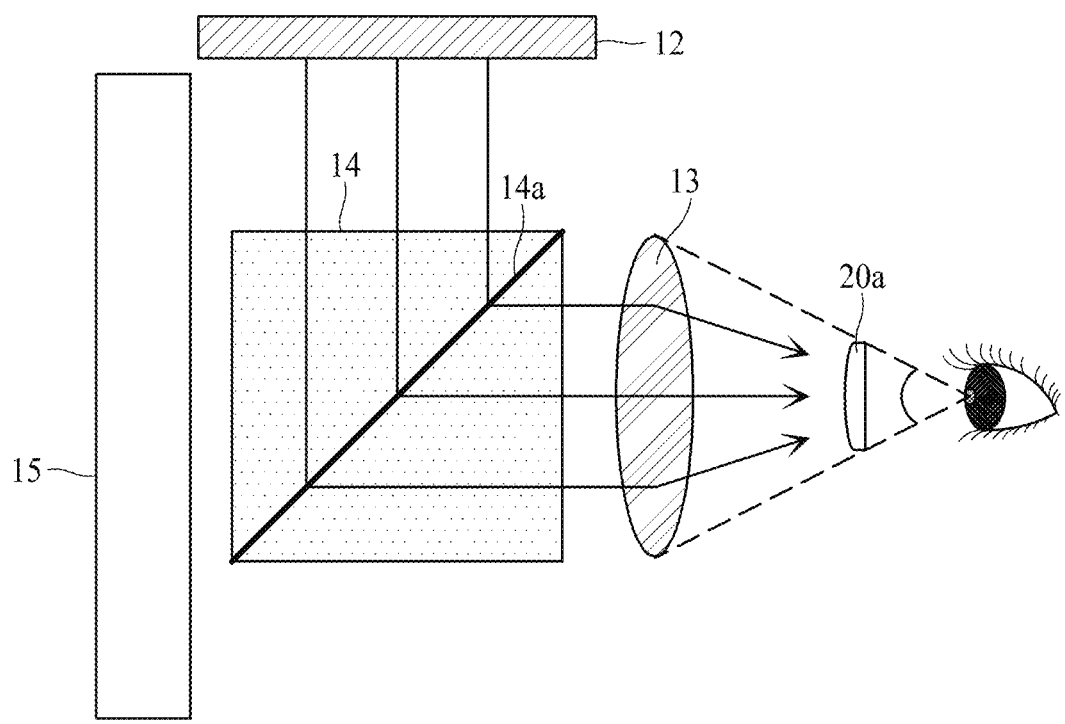

FIGS. 10A to 10C illustrate a display device according to another embodiment of the present disclosure, which relate to a head mounted display (HMD) device. FIG. 10A is a schematic perspective view, FIG. 10B is a schematic plane view of a virtual reality (VR) structure, and FIG. 10C is a cross sectional view of an augmented reality (AR) structure.

As shown in FIG. 10A, the head mounted display (HMD) device according to the present disclosure includes a receiving case 10, and a head mounted band 30.

A display device, a lens array, and an ocular eyepiece may be received in the inside of the receiving case 10.

The head mounted band 30 is fixed to the receiving case 10. In the drawings, the head mounted band 30 is configured to surround an upper surface and both lateral surfaces in a user's head, but not limited to this structure. For example, the head mounted band is provided to fix the head mounted display (HMD) device to a user's head, which may be substituted by an eyeglass-frame shape or a helmet-shaped structure.

As shown in FIG. 10B, the head mounted display (HMD) device of the virtual reality (VR) structure according to the present disclosure includes a left-eye display device 12, a right-eye display device 11, a lens array 13, a left-eye ocular eyepiece 20a, and a right-eye ocular eyepiece 20b.

The left-eye display device 12, the right-eye display device 11, the lens array 13, and the left-eye ocular eyepiece 20a, and the right-eye ocular eyepiece 20b are received in the aforementioned receiving case 10.

The same image may be displayed on the left-eye display device 12 and the right-eye display device 11. In this case, a user can watch a two-dimensional (2D) image. If an image for a left eye is displayed on the left-eye display device 12, and an image for a right eye is displayed on the right-eye display device 11, a user can watch a three-dimensional (3D) image. Each of the left-eye display device 12 and the right-eye display device 11 may be formed of the aforementioned display device shown in FIGS. 1 to 7. In this case, an upper portion corresponding to a surface for displaying an image in FIGS. 1 to 7, for example, the color filter 900 confronts the lens array 13.

The lens array 13 may be disposed between the left-eye ocular eyepiece 20a and the left-eye display device 12 while being apart from each of the left-eye ocular eyepiece 20a and the left-eye display device 12. That is, the lens array 13 may be positioned at the front of the left-eye ocular eyepiece 20a and at the rear of the left-eye display device 12. Also, the lens array 13 may be disposed between the right-eye ocular eyepiece 20b and the right-eye display device 11 while being apart from each of the right-eye ocular eyepiece 20b and the right-eye display device 11. That is, the lens array 13 may be positioned at the front of the right-eye ocular eyepiece 20b and at the rear of the right-eye display device 11.

The lens array 13 may be a micro lens array. The lens array 13 may be substituted by a pin hole array. Owing to the lens array 13, an image displayed on the left-eye display device 12 or the right-eye display device 11 may be expanded and perceived by a user.

A user's left eye (LE) may be positioned at the left-eye ocular eyepiece 20a, and a user's right eye (RE) may be positioned at the right-eye ocular eyepiece 20b.

As shown in FIG. 10C, the head mounted display (HMD) device of the augmented reality (AR) structure according to the present disclosure includes a left-eye display device 12, a lens array 13, a left-eye ocular eyepiece 20a, a transmissive reflecting portion 14, and a transmission window 15. FIG. 10C shows only the left-eye structure, for convenience of explanation. The right-eye structure is identical in structure to the left-eye structure.

The left-eye display device 12, the lens array 13, the left-eye ocular eyepiece 20a, the transmissive reflecting portion 14, and the transmission window 15 are received in the aforementioned receiving case 10.

The left-eye display device 12 may be disposed at one side of the transmissive reflecting portion 14, for example, an upper side of the transmissive reflecting portion 14 without covering the transmission window 15. Accordingly, an image may be provided to the transmissive reflecting portion 14 under the condition that an ambient background seen through the transmission window 15 is not covered by the left-eye display device 12.

The left-eye display device 12 may be formed of the display device shown in FIGS. 1 to 7. In this case, an upper portion corresponding to a surface for displaying an image in FIGS. 1 to 7, for example, the color filter 900 confronts the transmissive reflecting portion 14.

The lens array 13 may be provided between the left-eye ocular eyepiece 20a and the transmissive reflecting portion 14.

A user's left eye is positioned at the left-eye ocular eyepiece 20a.

The transmissive reflecting portion 14 is disposed between the lens array 13 and the transmission window 15. The transmissive reflecting portion 14 may include a reflection surface 14a which partially transmits some of light, and also reflects the remaining light. The reflection surface 14a is configured to guide an image, which is displayed on the left-eye display device 12, toward the lens array 13. Thus, a user can watch an image displayed on the left-eye display device 12 together with the ambient background through the transmission window 15. That is, a user can watch one image obtained by a virtual image overlaid with the ambient real background, to thereby realize an augmented reality (AR).

The transmission window 15 is disposed in front of the transmissive reflecting portion 14.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate including a first sub pixel and a second sub pixel;
a first electrode patterned in each of the first sub pixel and the second sub pixel on the substrate;
a first emission layer provided in each of the first sub pixel and the second sub pixel on the first electrode, and configured to emit first colored light;
a second electrode provided in each of the first sub pixel and the second sub pixel on the first emission layer;
a second emission layer provided on the second electrode, and configured to emit second colored light; and
a third electrode provided on the second emission layer,
wherein the first electrode of the first sub pixel is relatively larger than the first electrode of the second sub pixel,
wherein the first electrode of the first sub pixel is electrically connected with the second electrode of the first sub pixel, and the first electrode of the second sub pixel is insulated from the second electrode of the second sub pixel,
wherein the substrate includes a first sub pixel area provided with the plurality of first sub pixels arranged in a first direction, and a second sub pixel area provided with the plurality of second sub pixels arranged in the first direction and disposed adjacent to the first sub pixel area in a second direction, and
wherein the second electrode disposed in the second sub pixel area extends along the plurality of second sub pixels, and one end of the second electrode disposed in the second sub pixel area is in contact with the third electrode.

2. The display device according to claim 1, wherein the second electrode of the second sub pixel is electrically connected with the third electrode.

3. The display device according to claim 1, wherein the second emission layer of the first sub pixel emits light, and the first emission layer of the second sub pixel emits light.

4. The display device according to claim 1, wherein the first emission layer is patterned in each of the first sub pixel and the second sub pixel.

5. The display device according to claim 4,
wherein the first sub pixel is provided with the first emission layer whose size is smaller than that of the first electrode of the first sub pixel so as to expose the first electrode of the first sub pixel, and
the second sub pixel is provided with the first emission layer whose size is larger than that of the first electrode of the second sub pixel so as to cover the first electrode of the second sub pixel.

6. The display device according to claim 5, wherein the second electrode is patterned in each of the first sub pixel and the second sub pixel.

7. The display device according to claim 6, wherein, in case of the first sub pixel, the second electrode is relatively larger than the first emission layer so as to make the exposed first electrode and the second electrode be in contact with each other.

8. The display device according to claim 1, further comprising:
an auxiliary electrode provided in each of the first sub pixel and the second sub pixel and disposed below the first electrode; and
a thin film transistor provided between the substrate and the auxiliary electrode,
wherein the auxiliary electrode is connected with the thin film transistor, and is applied with a high potential voltage.

9. The display device according to claim 8, further comprising a bank provided to cover an end of the auxiliary electrode and configured to expose some area of the auxiliary electrode,
wherein the first electrode of the first sub pixel is formed on an upper surface of the exposed auxiliary electrode and a lateral surface of the bank.

10. The display device according to claim 9, wherein the first electrode of the first sub pixel is in contact with the second electrode of the first sub pixel on the bank.

11. The display device according to claim 1, wherein the second electrode disposed in the first sub pixel area is spaced apart from the second electrode disposed in the second sub pixel area.

12. The display device according to claim 11, wherein the second electrode disposed in the first sub pixel area is patterned in each of the plurality of the first sub pixels.

13. A display device, comprising:
a substrate including a first sub pixel, a second sub pixel, and a third sub pixel;
a first electrode patterned in each of the first sub pixel, the second sub pixel, and the third sub pixel on the substrate;
a first emission layer provided on the first electrode and configured to emit first colored light;
a second electrode provided on the first emission layer;
a second emission layer provided on the second electrode and configured to emit second colored light; and
a third electrode provided on the second emission layer,
wherein the same voltage is applied to the first electrode and the second electrode in each of the first sub pixel and the third sub pixel,
wherein the same voltage is applied to the second electrode and the third electrode in the second sub pixel,
wherein the second emission layer disposed between the second electrode and the third electrode emits light in each of the first sub pixel and the third sub pixel, and
wherein the first emission layer disposed between the first electrode and the second electrode emits light in the second sub pixel.

14. The display device according to claim 13, wherein a size of the first electrode in each of the first sub pixel and the third sub pixel is different from a size of the first electrode in the second sub pixel.

15. The display device according to claim 13,
wherein each of the first sub pixel and the third sub pixel is provided with the first emission layer whose size is smaller than that of the first electrode in each of the first sub pixel and the third sub pixel so as to expose the first electrode in each of the first sub pixel and the third sub pixel, and
the second sub pixel is provided with the first emission layer whose size is larger than that of the first electrode in the second sub pixel so as to cover the first electrode in second sub pixel.

16. The display device according to claim 15, wherein the second electrode is patterned in each of the first sub pixel, the second sub pixel, and the third sub pixel.

17. The display device according to claim 13, further comprising a red color filter disposed corresponding to the first sub pixel and configured to transmit red colored light therethrough, and
a green color filter disposed corresponding to the third sub pixel and configured to transmit green colored light therethrough.

* * * * *